United States Patent
Trindade et al.

(10) Patent No.: US 12,398,031 B2
(45) Date of Patent: Aug. 26, 2025

(54) MICRO-DEVICE STRUCTURES WITH ETCH HOLES

(71) Applicant: X-Celeprint Limited, Dublin (IE)

(72) Inventors: António José Marques Trindade, Cork (IE); Pierluigi Rubino, Cork (IE)

(73) Assignee: X-Celeprint Limited, Dublin (IE)

( * ) Notice: Subject to any disclaimer, the term of this patent is extended or adjusted under 35 U.S.C. 154(b) by 0 days.

(21) Appl. No.: 18/646,280

(22) Filed: Apr. 25, 2024

(65) Prior Publication Data

US 2025/0042717 A1  Feb. 6, 2025

Related U.S. Application Data

(63) Continuation of application No. 17/475,046, filed on Sep. 14, 2021, now Pat. No. 12,006,205, which is a continuation-in-part of application No. 17/066,448, filed on Oct. 8, 2020, now Pat. No. 11,952,266.

(60) Provisional application No. 63/173,988, filed on Apr. 12, 2021.

(51) Int. Cl.
*B81B 1/00* (2006.01)
*H10N 30/30* (2023.01)

(52) U.S. Cl.
CPC .......... *B81B 1/004* (2013.01); *H10N 30/306* (2023.02); *B81B 2201/058* (2013.01); *B81B 2203/0118* (2013.01); *B81B 2203/0307* (2013.01); *B81B 2203/0353* (2013.01)

(58) Field of Classification Search
CPC .............. B81B 1/004; B81B 2201/058; B81B 2203/0118; B81B 2203/0307; B81B 2203/0353; H10N 30/306; B81C 1/00476
See application file for complete search history.

(56) References Cited

U.S. PATENT DOCUMENTS

| | | |
|---|---|---|
| 6,142,358 A | 11/2000 | Cohn et al. |
| 7,195,733 B2 | 3/2007 | Rogers et al. |
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |

(Continued)

OTHER PUBLICATIONS

Flader, I.B. et al., Micro-Tethering for Fabrication of Encapsulated Inertial Sensors with High Sensitivity, Journal of Microelectromechanical Systems, 28(3):372-381 (2019).

(Continued)

*Primary Examiner* — Yasser A Abdelaziez

(74) *Attorney, Agent, or Firm* — Choate, Hall & Stewart LLP; Michael D. Schmitt

(57) ABSTRACT

A micro-device structure comprises a source substrate having a sacrificial layer comprising a sacrificial portion adjacent to an anchor portion, a micro-device disposed completely over the sacrificial portion, the micro-device having a top side opposite the sacrificial portion and a bottom side adjacent to the sacrificial portion and comprising an etch hole that extends through the micro-device from the top side to the bottom side, and a tether that physically connects the micro-device to the anchor portion. A micro-device structure comprises a micro-device disposed on a target substrate. Micro-devices can be any one or more of an antenna, a micro-heater, a power device, a MEMs device, and a microfluidic reservoir.

19 Claims, 19 Drawing Sheets

(56) References Cited

U.S. PATENT DOCUMENTS

| | | | |
|---|---|---|---|
| 7,662,545 | B2 | 2/2010 | Nuzzo et al. |
| 7,704,684 | B2 | 4/2010 | Rogers et al. |
| 7,799,699 | B2 | 9/2010 | Nuzzo et al. |
| 7,932,123 | B2 | 4/2011 | Rogers et al. |
| 7,943,491 | B2 | 5/2011 | Nuzzo et al. |
| 7,972,875 | B2 | 7/2011 | Rogers et al. |
| 8,039,847 | B2 | 10/2011 | Nuzzo et al. |
| 8,333,860 | B1 | 12/2012 | Bibl et al. |
| 8,470,701 | B2 | 6/2013 | Rogers et al. |
| 8,558,243 | B2 | 10/2013 | Bibl et al. |
| 8,722,458 | B2 | 5/2014 | Rogers et al. |
| 8,791,474 | B1 | 7/2014 | Bibl et al. |
| 8,794,501 | B2 | 8/2014 | Bibl et al. |
| 8,835,940 | B2 | 9/2014 | Hu et al. |
| 8,865,489 | B2 | 10/2014 | Rogers et al. |
| 8,877,648 | B2 | 11/2014 | Bower et al. |
| 8,889,485 | B2 | 11/2014 | Bower |
| 8,934,259 | B2 | 1/2015 | Bower et al. |
| 8,941,215 | B2 | 1/2015 | Hu et al. |
| 8,987,765 | B2 | 3/2015 | Bibl et al. |
| 9,049,797 | B2 | 6/2015 | Menard et al. |
| 9,087,764 | B2 | 7/2015 | Chan et al. |
| 9,105,714 | B2 | 8/2015 | Hu et al. |
| 9,111,464 | B2 | 8/2015 | Bibl et al. |
| 9,139,425 | B2 | 9/2015 | Vestyck |
| 9,153,171 | B2 | 10/2015 | Sakariya et al. |
| 9,161,448 | B2 | 10/2015 | Menard et al. |
| 9,165,989 | B2 | 10/2015 | Bower et al. |
| 9,166,114 | B2 | 10/2015 | Hu et al. |
| 9,178,123 | B2 | 11/2015 | Sakariya et al. |
| 9,217,541 | B2 | 12/2015 | Bathurst et al. |
| 9,240,397 | B2 | 1/2016 | Bibl et al. |
| 9,252,375 | B2 | 2/2016 | Bibl et al. |
| 9,355,854 | B2 | 5/2016 | Meitl et al. |
| 9,358,775 | B2 | 6/2016 | Bower et al. |
| 9,367,094 | B2 | 6/2016 | Bibl et al. |
| 9,412,727 | B2 | 8/2016 | Menard et al. |
| 9,478,583 | B2 | 10/2016 | Hu et al. |
| 9,484,504 | B2 | 11/2016 | Bibl et al. |
| 9,520,537 | B2 | 12/2016 | Bower et al. |
| 9,555,644 | B2 | 1/2017 | Rogers et al. |
| 9,583,533 | B2 | 2/2017 | Hu et al. |
| 9,589,944 | B2 | 3/2017 | Higginson et al. |
| 9,601,356 | B2 | 3/2017 | Bower et al. |
| 9,640,715 | B2 | 5/2017 | Bower et al. |
| 9,716,082 | B2 | 7/2017 | Bower et al. |
| 9,761,754 | B2 | 9/2017 | Bower et al. |
| 9,765,934 | B2 | 9/2017 | Rogers et al. |
| 9,865,832 | B2 | 1/2018 | Bibl et al. |
| 9,929,053 | B2 | 3/2018 | Bower et al. |
| 11,952,266 | B2 | 4/2024 | Rubino |
| 12,006,205 | B2 | 6/2024 | Trindade et al. |
| 2002/0086540 | A1 | 7/2002 | Lebouitz |
| 2003/0141570 | A1 | 7/2003 | Chen et al. |
| 2004/0248376 | A1 | 12/2004 | Kiihamaki |
| 2007/0173034 | A1* | 7/2007 | Tsurume .............. H10D 86/0214 257/E27.111 |
| 2010/0306993 | A1 | 12/2010 | Mayyas et al. |
| 2013/0277770 | A1 | 10/2013 | Tsai et al. |
| 2013/0300812 | A1 | 11/2013 | Bibl et al. |
| 2013/0309792 | A1 | 11/2013 | Tischler et al. |
| 2013/0316487 | A1 | 11/2013 | de Graff et al. |
| 2014/0159043 | A1 | 6/2014 | Sakariya et al. |
| 2016/0093600 | A1 | 3/2016 | Bower et al. |
| 2016/0236930 | A1 | 8/2016 | North et al. |
| 2017/0338374 | A1 | 11/2017 | Zou et al. |
| 2017/0358717 | A1 | 12/2017 | Cok et al. |
| 2018/0174910 | A1* | 6/2018 | Bower .................. H10D 86/01 |
| 2022/0112073 | A1 | 4/2022 | Trindade et al. |
| 2022/0112078 | A1 | 4/2022 | Rubino |
| 2024/0199413 | A1 | 6/2024 | Rubino |

OTHER PUBLICATIONS

Bower, C. A. et al., Emissive displays with transfer-printed assemblies of 8 μm×15 μm inorganic light-emitting diodes, Photonics Research, 5(2):A23-A29, (2017).

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335-341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Haobing, L. et al., Layout controlled one-step dry etch and release of MEMS using deep RIE on SOI wafer, Journal of Microelectromechanical Systems, 15(3):541-547 (2006).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

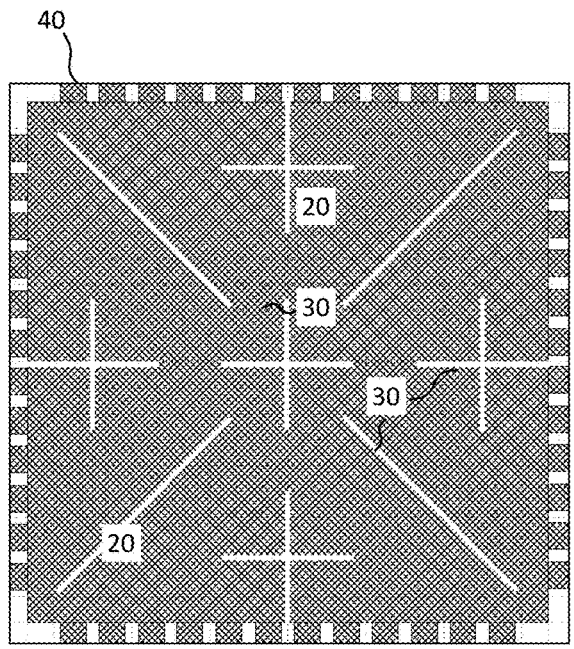
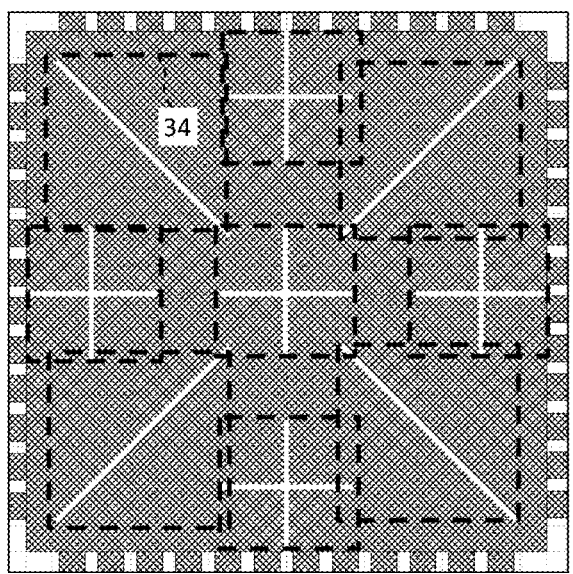
FIG. 21A
FIG. 21B
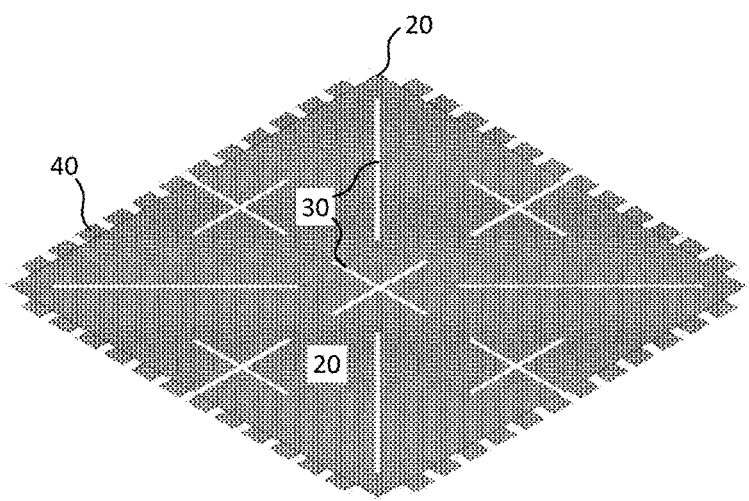
FIG. 21C

MICRO-DEVICE STRUCTURES WITH ETCH HOLES

PRIORITY APPLICATIONS

This application is a continuation of U.S. patent application Ser. No. 17/475,046, filed on Sep. 14, 2021, now issued as U.S. Pat. No. 12,006,205, which claims the benefit of U.S. patent application Ser. No. 17/066,448, filed on Oct. 8, 2020, now issued as U.S. Pat. No. 11,952,266, and U.S. Provisional Patent Application No. 63/173,988, filed on Apr. 12, 2021, the disclosure of each of which is hereby incorporated by reference herein in its entirety.

CROSS REFERENCE TO RELATED APPLICATIONS

The present disclosure is related to U.S. patent application Ser. No. 17/006,498, entitled Non-Linear Tethers for Suspended Devices by Trindade et al., filed Aug. 26, 2020, and to U.S. patent application Ser. No. 17/066,448, entitled Micro-Device Structures with Etch Holes by Rubino, filed Oct. 8, 2020, the disclosure of each of which is incorporated by reference herein in its entirety.

TECHNICAL FIELD

The present disclosure generally relates to micro-transfer printed devices and structures that enable device release from a source wafer.

BACKGROUND

Components can be transferred from a source wafer to a target substrate using micro-transfer printing. Methods for transferring small, active components from one substrate to another are described in U.S. Pat. Nos. 7,943,491, 8,039,847, and 7,622,367. In these approaches, small integrated circuits are formed on a native semiconductor source wafer. The small, unpackaged integrated circuits, or chiplets, are released from the native source wafer by pattern-wise etching sacrificial portions of a sacrificial layer located beneath the chiplets, leaving each chiplet suspended over an etched sacrificial portion by a tether physically connecting the chiplet to an anchor separating the etched sacrificial layer portions. A viscoelastic stamp is pressed against the process side of the chiplets on the native source wafer, adhering each chiplet to an individual stamp post. The stamp with the adhered chiplets is removed from the native source wafer. The chiplets on the stamp posts are then pressed against a non-native target substrate or backplane with the stamp and adhered to the target substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a target substrate or backplane.

Crystalline source wafers can etch anisotropically so that the etch proceeds more rapidly in one direction than in another direction with respect to the crystal planes in the source wafer. Thus, a sacrificial portion of the source wafer can etch more rapidly in one direction than another so that a micro-device or tether disposed over the sacrificial portion is only partially undercut and are partially unetched. Despite the difference in etch rates in different directions in a crystalline source wafer, micro-devices, tethers, and anchor portions can still be attacked by the etchant, especially if the etch takes a substantial amount of time, compromising the integrity of the micro-device, tether, and the anchor portion and possibly leading to failures in micro-device pickup from the source wafer with the stamp and failures in micro-device performance on the target substrate. Furthermore, slow etch rates can reduce manufacturing throughput and, because the etch chemistry selectivity amongst materials is not infinite, the encapsulating layers should be exposed as little as possible to the wet etch chemistry as they also etch away (albeit at much slower rates).

There is a need, therefore, for micro-device and source wafer structures and methods that facilitate micro-device release from a source wafer in less time and with reduced etching damage to micro-devices and transfer structures.

SUMMARY

The present disclosure provides, inter alia, structures and methods for improving the release of micro-devices from a source substrate to enable micro-transfer printing the micro-devices from the source substrate to a target substrate. According to some embodiments, a micro-device structure comprises a source substrate having a sacrificial layer comprising a sacrificial portion adjacent to one or more anchor portions (e.g., one or more anchors) and a micro-device disposed completely over the sacrificial portion. The sacrificial portion can be the substrate itself or a gap formed by etching a sacrificial portion of material, for example. The micro-device can have a top side opposite the sacrificial portion and a bottom side adjacent to the sacrificial portion and the micro-device can comprise an etch hole that extends through the micro-device from the top side to the bottom side. A tether can physically connect the micro-device to the anchor portion. According to some embodiments, the etch hole is in contact with the sacrificial portion and exposes at least a portion of the sacrificial portion, the etch hole is not at a geometric center of the micro-device, the etch hole is at the geometric center of the micro-device, the etch hole is rectangular, the etch hole has a portion of a perimeter that is at the geometric center, or any compatible combination of these.

According to embodiments of the present disclosure, the sacrificial portion of the source substrate has a crystalline structure that is anisotropically etchable, the source substrate is made of silicon {100}, the source substrate has a crystalline structure with a {100} orientation (such that a {100} crystal plane is exposed at a surface of the source substrate) and the bottom side of micro-device is substantially parallel to the source substrate surface and to a {100} crystal plane on the surface, or any combination of these. According to some embodiments, the micro-device has a micro-device edge direction oriented at an angle from 0 to 90 degrees, and in some embodiments 30 to 60 degrees, with respect to the {110} crystal plane. The micro-device can have a micro-device edge direction oriented at an angle of substantially (e.g., within manufacturing tolerances) 45 degrees with respect to the {110} crystal plane. The source substrate can have a crystalline structure with a {100} crystal plane, the micro-device can have a micro-device width and the direction of the micro-device width can be substantially (e.g., within manufacturing tolerances) parallel to the {100} crystal plane and oriented from 0 to 90 degrees and more specifically 30 to 60 degrees, such as 45 degrees, with respect to a {110} crystal plane. The etch-hole width can be measured in a direction parallel to the tether width and can be longer than the etch-hole length.

According to some embodiments, the etch hole is rectangular and has an etch-hole width, the tether has a tether width connecting the micro-device to the anchor portion, and the etch-hole width is no less than the tether width. That is, the extent of the connection between the micro-device and the tether (or the anchor portion and the tether) in a direction is equal to or smaller than the extent of the etch hole in the same direction, e.g., in a direction parallel to the connection between the micro-device and the tether or to the connection between the anchor portion and the tether. In some embodiments, the etch-hole width is greater than the tether width. The etch hole and the micro-device can both be rectangular. The etch hole can have an etch-hole edge, the micro-device can have a micro-device edge, and the etch-hole edge can be substantially parallel to the micro-device edge. The etch hole can have an etch-hole edge with an etch-hole width in the range of 5 microns to 20 microns. The micro-device can have a micro-device length no greater than 5 mm, 2 mm, 1 mm, 500 microns, 200 microns, 150 microns, or 100 microns.

According to some embodiments, the tether physically connects the anchor portion directly to a corner of the micro-device. According to some embodiments, a micro-device structure comprises micro-devices, each micro-device disposed completely over a corresponding sacrificial portion in a direction orthogonal to the source substrate surface and physically connected by a respective tether to the anchor portion, wherein each of the micro-devices and the respective tether are rotated with respect to any other of the micro-devices and the respective tether. The anchor portion can have a surface that is a square or circle. The anchor portion can substantially be a cube or cylinder, or an equivalent structure.

According to embodiments of the present disclosure, a micro-device structure comprises a target substrate, a micro-device disposed on or over the target substrate, the micro-device having a top side and a bottom side opposite the top side and adjacent to the target substrate, and comprising one or more etch holes that extend through the micro-device from the top side to the bottom side, and at least a portion of a broken (e.g., fractured) or separated tether physically connected to the micro-device. The etch hole can have an etch-hole edge with an etch-hole width in the range of 5 microns to 20 microns. The micro-device can have a micro-device length no greater than 5 mm, 2 mm, 1 mm, 500 microns, 200 microns, 150 microns, or 100 microns.

According to some embodiments of the present disclosure, a micro-device structure comprises a source substrate having a sacrificial layer comprising one or more sacrificial portions each adjacent to an anchor portion, micro-devices, each disposed completely over one of the one or more sacrificial portions, and a respective tether for each of the micro-devices. Each of the micro-devices is physically connected to the anchor portion by the respective tether. In some embodiments, each of the micro-devices and the respective physically connected tether are rotated or reflected, or both reflected and rotated, with respect to each other of the micro-devices and the respective physically connected tether. In some embodiments, the respective tether for each of the micro-devices physically connects the anchor portion directly to a different corner of the micro-device or to a portion of the micro-device closer to the corner than to a center or opposite corner along an edge of the micro-device.

According to some embodiments of the present disclosure, the micro-device is, comprises, or provides one or more of an antenna, a micro-heater, a power device, a MEMs device, and a micro-fluidic reservoir.

According to some embodiments of the present disclosure, a method of making a micro-device structure comprises providing a source substrate comprising a sacrificial layer (e.g., a portion or layer of the source substrate) comprising or providing a sacrificial portion adjacent to an anchor portion, providing a micro-device disposed completely over the sacrificial portion, the micro-device having a top side opposite the sacrificial layer and a bottom side adjacent to the sacrificial layer and comprising an etch hole that extends through the micro-device from the top side to the bottom side and a tether that physically connects the micro-device to the anchor portion, wherein the etch hole exposes a portion of the sacrificial portion, providing an etchant, and etching the sacrificial portion, wherein at least the exposed portion of the sacrificial portion is etched by the etchant passing through the etch hole, thereby forming a gap between the micro-device and the source substrate such that the micro-device is suspended from the anchor portion by the tether, for example over the source substrate or over a target substrate.

Methods of the present disclosure can comprise providing a stamp and a target substrate, contacting the micro-device with the stamp to adhere the micro-device to the stamp, removing the stamp from the source substrate, thereby breaking (e.g., fracturing) or separating the tether, pressing the micro-device to a target substrate to adhere the micro-device to the target substrate, and removing the stamp. The etchant can be TMAH or KOH.

According to some embodiments of the present disclosure, an intermediate structure wafer comprises a source substrate having a sacrificial layer comprising a sacrificial portion adjacent to an anchor portion and an intermediate substrate disposed completely over the sacrificial portion. The intermediate substrate has a top side opposite the sacrificial portion and a bottom side adjacent to the sacrificial portion and comprises an etch hole that extends through the intermediate substrate from the top side to the bottom side. One or more micro-devices are disposed on the intermediate substrate (e.g., the top side of the intermediate substrate). The one or more micro-devices are non-native to the intermediate substrate. A tether physically connects the intermediate substrate to the anchor portion.

In some embodiments, one of the one or more micro-devices comprises a micro-device comprising a micro-device etch hole aligned with the etch hole in the intermediate substrate.

In some embodiments, the one or more micro-devices is a plurality of micro-devices that are electrically, optically, or both electrically and optically interconnected.

According to embodiments of the present disclosure, a micro-device structure comprises a micro-device having a top side and a bottom side, one or more etch holes, an anchor, and one or more tethers. Each of the one or more etch holes is an etch hole that extends through the micro-device from the top side to the bottom side. In some embodiments, at least one etch hole has an aspect ratio no less than 2:1. The one or more tethers physically connect the micro-device to the anchor.

According to embodiments of the present disclosure, any straight line parallel to an edge side of the micro-device drawn from a concave corner on a first edge side of the micro-device to a second edge side of the micro-device opposite the first edge side contacts (e.g., intersects or touches) an etch hole. Concave corners can be defined by the micro-device alone or by the intersection of a tether with the micro-device. An edge side is a side of the micro-device that is on a perimeter of the micro-device and does not correspond to a top side or bottom side of the micro-device. An edge side can be a micro-device edge and can be a line segment portion of a micro-device having a polygonal perimeter. Opposing or opposite sides (edge sides) are edge sides that do not contact and are not adjacent to each other, for example opposite edge sides of a rectangular micro-device.

According to embodiments of the present disclosure, any orthogonal line segment angle drawn from a first concave corner on a first edge side of the micro-device to a second concave corner on a second edge side of the micro-device adjacent to the first edge side contacts (e.g., intersects or touches) an etch hole.

According to embodiments of the present disclosure, at least one etch hole has two or more portions that extend in different directions and is disposed closer to a center of the micro-device than to an edge side of the micro-device.

According to embodiments of the present disclosure, the micro-device is unitary and contiguous. The anchor can surround the micro-device, for example the anchor can surround all of the edge sides of the micro-device, can extend around a perimeter of the micro-device, or surrounds two or more edge sides around the perimeter of the micro-device. In some embodiments, no etch hole intersects an edge side of the micro-device. In some embodiments, one or more etch holes intersect an edge of the micro-device. At least one etch hole can be disposed at an angle that is not parallel or orthogonal to an edge side of the micro-device or at least one etch hole can form an x ('x') shape, a plus ('+') shape, a T ('T') shape, a Y ('Y') shape, or a cross shape.

According to embodiments of the present disclosure, a micro-device structure comprises a source substrate, the anchor is disposed on or is a portion of the source substrate, and the micro-device is separated from the source wafer by a cavity. The source substrate can have a crystalline structure that is anisotropically etchable. The source substrate can be made of silicon, for example silicon {100} or silicon {111}. According to some embodiments, the source substrate has a crystalline structure with a {100} orientation and the bottom side of the micro-device is substantially parallel to a {100} crystal plane at a surface of the source substrate. According to some embodiments, the micro-device has a micro-device edge direction (e.g., edge side direction) oriented at an angle from 30 to 60 degrees with respect to a {110} crystal plane of the crystalline structure. According to some embodiments, the micro-device comprises a micro-device edge (e.g., edge side) having a direction oriented at an angle of substantially 45 degrees with respect to the {110} crystal plane. According to some embodiments, the source substrate has a crystalline structure with a {100} crystal plane, the micro-device has a micro-device length greater than a micro-device width, and the micro-device length is in a direction that is substantially parallel to the {100} crystal plane.

According to some embodiments of the present disclosure, at least one etch hole and the micro-device (e.g., excluding any tethers) are both rectangular. In some embodiments the etch hole has an etch-hole edge, the micro-device has a micro-device edge, and the etch-hole edge is substantially parallel to, substantially orthogonal to, or substantially at 45 degrees to the micro-device edge.

According to some embodiments of the present disclosure, one or more tethers (e.g., a plurality of tethers) physically connect one edge side (e.g., only one edge side) of the micro-device to the anchor. In some micro-device structures of the present disclosure, the micro-device can have two or more edge sides and can comprise one or more tethers (e.g., multiple tethers) physically connecting two or more edge sides of the micro-device to the anchor or to multiple anchors. The micro-device structure can comprise piezoelectric material and the micro-device can be or comprise a mass that mechanically stresses the piezoelectric material when mechanically perturbed.

According to some embodiments of the present disclosure, a micro-device system comprises a target substrate, one or more micro-device structures disposed on the target substrate, and a fractured or separated structure tether physically attached to the anchor.

According to some embodiments of the present disclosure, a micro-device system comprises a source substrate, one or more micro-device structures native to and disposed on the source substrate, and a structure tether (e.g., a fractured or separated tether) physically attached to the anchor.

According to some embodiments of the present disclosure, a micro-device structure comprises a micro-device having a top side and a bottom side and comprising two or more etch holes, wherein each of the two or more etch holes is an etch hole that extends through the micro-device from the top side to the bottom side, an anchor, and one or more tethers physically connecting the micro-device to the anchor.

According to some embodiments of the present disclosure, a micro-device structure comprises a micro-device having a top side and a bottom side, one or more etch holes, wherein each of the one or more etch holes is an etch hole that extends through the micro-device from the top side to the bottom side, an anchor, and two or more tethers physically connecting the micro-device to the anchor.

According to some embodiments of the present disclosure, a micro-device structure comprises a micro-device having a top side and a bottom side, two or more concave corners, one or more etch holes, wherein each of the one or more etch holes is an etch hole that extends through the micro-device from the top side to the bottom side, an anchor, and wherein any straight line parallel to an edge side of the micro-device drawn from a concave corner on a first edge side of the micro-device to a second edge side of the micro-device opposite the first edge side contacts an etch hole.

According to some embodiments of the present disclosure, a micro-device structure comprises a micro-device having a top side and a bottom side, one or more etch holes, wherein each of the one or more etch holes is an etch hole that extends through the micro-device from the top side to the bottom side, an anchor, and one or more tethers physically connecting the micro-device to the anchor, and wherein any orthogonal line segment angle drawn from a first concave corner on a first edge side of the micro-device to a second concave corner on a second edge side of the micro-device adjacent to the first edge side contacts an etch hole.

According to some embodiments of the present disclosure, a micro-device structure comprises a micro-device having a top side and a bottom side, one or more etch holes, wherein each of the one or more etch holes is an etch hole that extends through the micro-device from the top side to the bottom side, an anchor, and one or more tethers physically connecting the micro-device to the anchor, and wherein at least one etch hole has two or more portions that extend in different directions and is disposed closer to a center of the micro-device than to an edge side of the micro-device.

According to embodiments of the present disclosure, a micro-device structure comprises a substrate comprising a sacrificial portion disposed in or on the substrate, a micro-device disposed entirely on the sacrificial portion, wherein (i) the micro-device has at least one of a length and a width no less than 100 µm (e.g., no less than 200 µm, 300 µm, 400 µm, 500 µm, 750 µm, or 1 mm) and a top side and a bottom side and (ii) comprises one or more etch holes and each of the one or more etch holes is an etch hole that extends through the micro-device from the top side to the bottom side, one or more anchors disposed on the substrate, and one or more tethers physically connecting the micro-device to the one or more anchors, wherein the one or more etch holes are sized, shaped, and oriented relative to the sacrificial portion such that the micro-device can be completely released by etching the sacrificial portion thereby suspending the micro-device over the substrate by only the one or more tethers (e.g., within two hours, one hour, 30 minutes, or 15 minutes of etching).

According to embodiments of the present disclosure, a micro-device structure comprises a substrate comprising a sacrificial portion disposed in or on the substrate, a micro-device disposed entirely on the sacrificial portion, wherein (i) the micro-device has at least one of a length and a width no less than 100 µm (e.g., no less than 200 µm, 300 µm, 400 µm, 500 µm, 750 µm, or 1 mm) and a top side and a bottom side and (ii) comprises one or more etch holes and each of the one or more etch holes is an etch hole that extends through the micro-device from the top side to the bottom side, one or more anchors disposed on the substrate, and one or more tethers physically connecting the micro-device to the one or more anchors, wherein the one or more etch holes are sized, shaped, and oriented relative to the sacrificial portion such that no pinned etch front forms when etching the sacrificial portion.

According to embodiments of the present disclosure, a micro-device having a top side and a bottom side comprises one or more etch holes, wherein each of the one or more etch holes is an etch hole that extends through the micro-device from the top side to the bottom side, wherein the one or more etch holes comprise a first etch hole extending into the micro-device from a first edge side, a second etch hole extending into the micro-device from a second edge side that is opposite the first edge side, and a third etch hole extending into the micro-device from a third edge side different from the first edge side and from the second edge side, wherein the third etch hole comprises a first portion that intersects the third edge side and a second portion that intersects an end of the first portion at a point other than an end of the second portion. The first portion can bisect the second portion, the first etch hole and the second etch hole can be parallel, the first etch hole and the second etch hole can be collinear, or the first portion can extend into the micro-device past the first etch hole and the second etch hole.

According to embodiments of the present disclosure, a micro-device having a top side and a bottom side comprises one or more etch holes, wherein each of the one or more etch holes is an etch hole that extends through the micro-device from the top side to the bottom side, and wherein the one or more etch holes comprise a plurality of etch holes disposed in a symmetric arrangement, the symmetric arrangement having a multifold symmetry and comprising a unit cell comprising a first portion of a first etch hole extending outward from a center of the micro-device, a second etch hole that is an interior etch hole and disposed parallel to an edge side of the micro-device, and a third etch hole that is an interior etch hole and that is co-linear with a center of the micro-device. The symmetric arrangement can have two-fold or four fold symmetry.

According to embodiments of the present disclosure, the first etch hole has a cross shape. The second etch hole and the third etch hole can be straight etch holes. The third etch hole can be collinear with both the center of the micro-device and a corner of the micro-device.

According to embodiments of the present disclosure, a micro-device having a top side and a bottom side comprises one or more etch holes, wherein each of the one or more etch holes is an etch hole that extends through the micro-device from the top side to the bottom side, and wherein the one or more etch holes comprise a first etch hole comprising a first portion and a second portion, wherein the first portion and the second portion intersect at respective interior points and a center of the first etch hole is disposed closer to a center of the micro-device than any edge side of the micro-device. The first portion and the second portion can each intersect the center of the micro-device. The first portion and the second portion can form a cross. The first portion can have a length equal to a length of the second portion. The first etch hole can be the only etch hole.

According to embodiments of the present disclosure, a micro-device structure comprises a micro-device, one or more anchors, and one or more tethers physically connecting the micro-device to the one or more anchors. Embodiments of the present disclosure can comprise a source substrate comprising a sacrificial portion disposed in or on the source substrate, wherein the one or more anchors are disposed on the source substrate and the micro-device is native to and disposed entirely on the sacrificial portion.

According to embodiments of the present disclosure, a micro-device structure comprises a micro-device having a top side and a bottom side and one or more etch holes. Each of the one or more etch holes is an etch hole that extends through the micro-device from the top side to the bottom side. An etch-hole protective coating comprising a material different from a material comprising the micro-device is disposed on the one or more etch holes (e.g., on sides of the one or more etch holes). The micro-device structure further comprises one or more anchors and one or more tethers physically connecting the micro-device to the one or more anchors. The etch-hole protective coating can also be disposed on a top side, on a bottom side, or on both the top side and the bottom side of the micro-device. The micro-device can be disposed over a sacrificial portion and the micro-device and the sacrificial portion can comprise a same material, e.g., silicon. In some embodiments, the micro-device comprises KNN.

Structures and methods described herein enable an efficient, effective, and fast release of a micro-transfer printable device or component from a source substrate (e.g., a native source wafer on or in which the device is disposed or formed) with reduced etching damage.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 21A is a plan view of a micro-device, tethers, and etch holes, FIG. 21B is a plan view of the micro-device, tethers, and etch holes of FIG. 21A indicating some pinned etch fronts, and FIG. 21C is a perspective of the micro-device, tethers, and etch holes of FIG. 21A according to illustrative embodiments of the present disclosure;

Figure 1A:
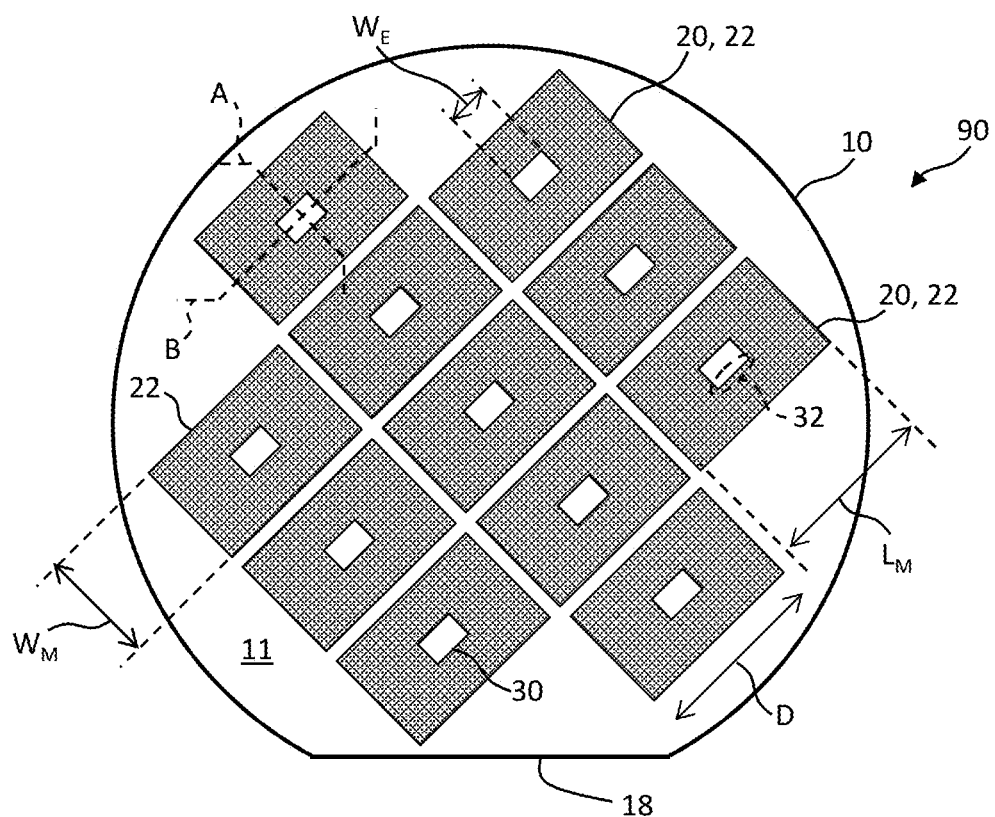
FIG. 1A is a schematic plan view of a source wafer according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, micro-device and source substrate (wafer) structures and methods that facilitate micro-device release from a source substrate in less time and with reduced etching damage to micro-devices and to tethering and anchor structures of the micro-device and source substrate, thereby facilitating the efficient construction, release, and micro-transfer printing of functional micro-devices from a source substrate. A source substrate can be a source wafer.

Figure 1B:
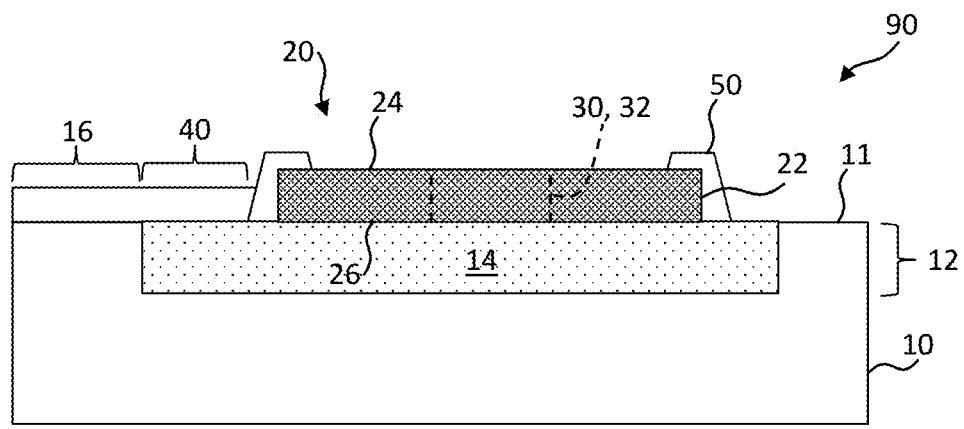
FIG. 1B is a schematic detail cross section of a micro-device on the source wafer taken across cross-section line A of FIG. 1A according to illustrative embodiments of the present disclosure.
Figure 1C:
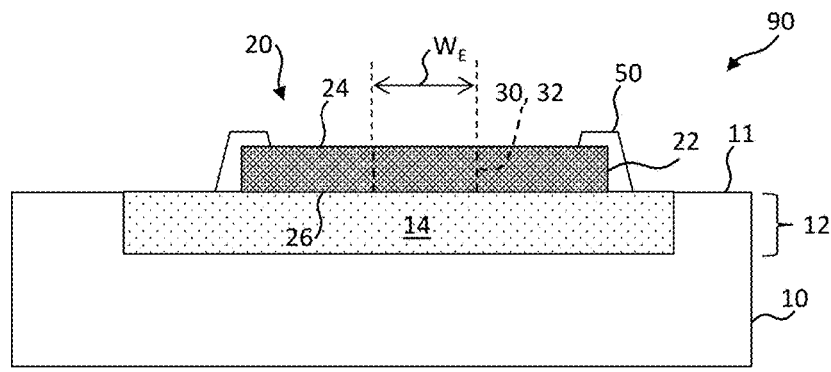
FIG. 1C is a schematic detail cross section of a micro-device on the source wafer taken across cross-section line B of FIG. 1A according to illustrative embodiments of the present disclosure.
Figure 1D:
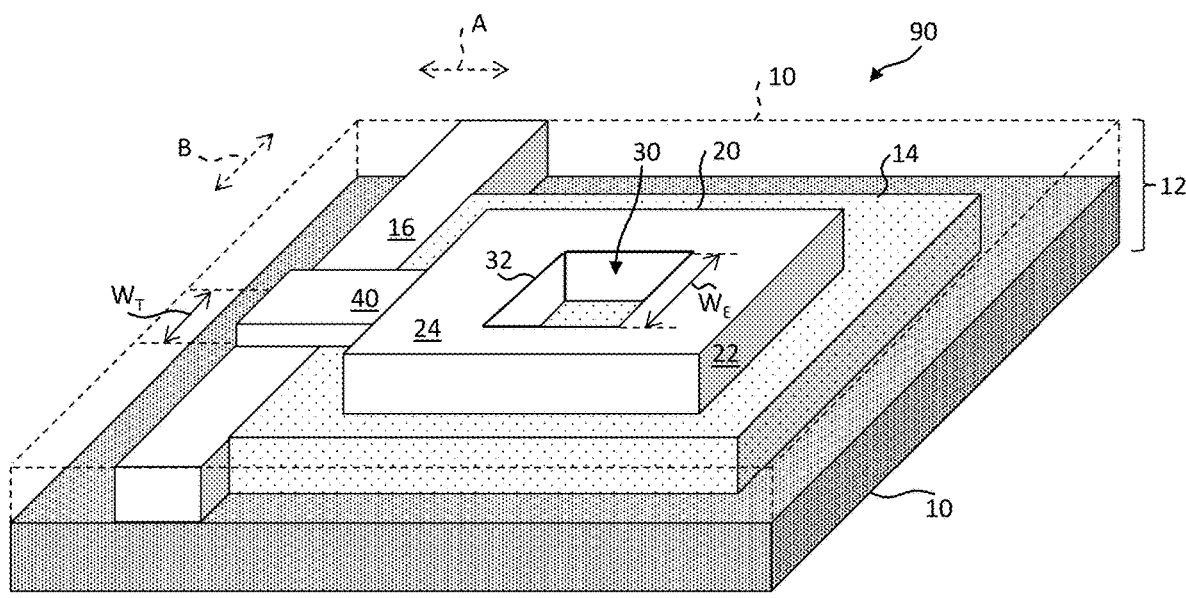
FIG. 1D is a schematic detail cut-away perspective of a micro-device on the source wafer corresponding to FIGS. 1A-1C according to illustrative embodiments of the present disclosure.
Figure 1E:
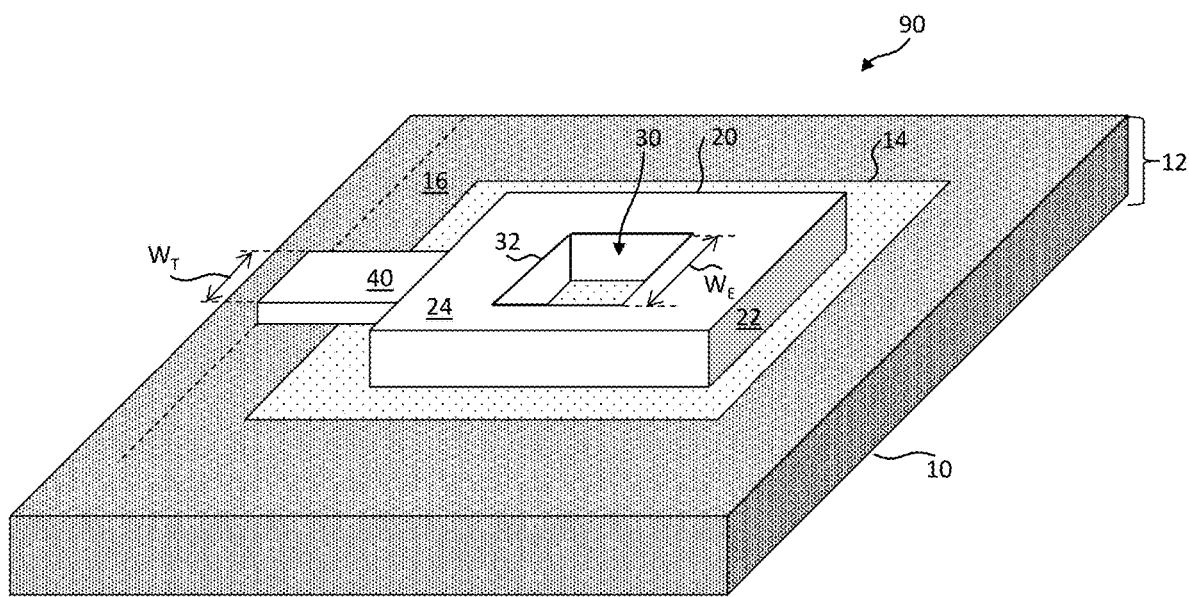
FIG. 1E is a detail perspective of a micro-device on the source wafer corresponding to FIGS. 1A-1C according to illustrative embodiments of the present disclosure.

According to some embodiments of the present disclosure and as shown in the plan view of FIG. 1A, the detail cross section of FIG. 1B taken across cross section line A of FIG. 1A, the detail cross section of FIG. 1C taken across cross section line B of FIG. 1A, and the detail perspectives of FIGS. 1D and 1E corresponding to FIG. 1A, a micro-device structure 90 comprises a source substrate 10 (e.g., a source wafer) having a sacrificial layer 12 comprising a sacrificial portion 14 adjacent to an anchor portion 16. A micro-device 20 is disposed completely over sacrificial portion 14. Micro-device 20 has a top side 24 opposite sacrificial layer 12 and sacrificial portion 14 and a bottom side 26 adjacent to sacrificial layer 12 and sacrificial portion 14. An etch hole 30 extends through micro-device 20 from top side 24 to bottom side 26 and exposes and contacts sacrificial portion 14, providing access to sacrificial portion 14 through etch hole 30 by an etchant. Etch hole 30 has an etch-hole width $W_E$. A tether 40 having a tether width $W_T$ physically connects micro-device 20 to anchor portion 16. Tether width $W_T$ and etch-hole width $W_E$ can be parallel to each other and can be in a direction parallel to an edge of anchor portion 16 adjacent to micro-device 20 or an edge of micro-device 20 adjacent to anchor portion 16 where tether 40 connects micro-device 20 to anchor portion 16 and parallel to source substrate surface 11, as shown in FIGS. 1C and 1D. As illustrated for example in FIG. 1A, edge-hole width $W_E$ can be greater than a length of edge hole 30 in a direction orthogonal to edge-hole width $W_E$ and edge-hole width $W_E$ can be in a direction parallel to a length $L_M$ of micro-device 20. Source substrate 10 has a source substrate surface 11 and a flat edge (source substrate flat 18) used to orient and position source substrate 10 for photolithographic processing, as is typical in the photolithographic arts. Source substrate flat 18 is usually specified and oriented with respect to the crystallographic structure of source substrate 10. In some embodiments, a location, orientation, or size of source substrate flat 18 indicates a doping characteristic of source substrate 10, for example p-type or n-type doping. Micro-device 20 has one or more micro-device edges 22 (e.g., micro-device edge sides 22). In some embodiments, micro-device 20 is rectangular and a micro-device edge 22 extends in a direction D parallel to source substrate surface 11 and at substantially 45 degrees to source substrate flat 18 (e.g., within manufacturing tolerances). In perspective cut-away FIG. 1D, source substrate 10 surrounds sacrificial portion 14 in a common plane, as indicated with dashed lines. FIG. 1E illustrates source substrate 10 extending to the common plane on which is disposed micro-device 20. As used herein, micro-device edge 22 is an edge side 22.

Etch hole 30 can be, but is not necessarily, centered at or aligns with (e.g., an edge of etch hole 30 aligns with) a geometric center of micro-device 20. Etch hole 30 can be, but is not necessarily, rectangular (e.g., square), and can have an etch-hole width $W_E$ (e.g., any extent) parallel to source substrate surface 11. Micro-device 20 can be protected by patterned dielectric structure(s) 50. Dielectric structure(s) 50 can be a part of micro-device 20 (e.g., an encapsulation layer), or a separate structure.

According to some embodiments of the present disclosure, source substrate 10 has a crystalline structure that is anisotropically etchable. For example, source substrate 10 can be a semiconductor or compound semiconductor substrate or have a semiconductor or compound semiconductor sacrificial layer 12 disposed on a substrate. In some embodiments, source substrate 10 is a silicon substrate, e.g., comprising monocrystalline silicon, such as silicon {100} or silicon {111}. Micro-device 20 can be constructed in an epitaxial layer of source substrate 10 using conventional photolithographic methods and materials. According to some embodiments and as shown in FIG. 1A, source substrate 10 has a crystalline structure with a {100} orientation (parallel to source substrate surface 11) and bottom side 26 (a bottom surface) of micro-device 20 is substantially parallel (e.g., within manufacturing tolerance) to source substrate surface 11 and the {100} crystal plane of source substrate 10. Likewise, ignoring any topographical structure formed by photolithographic processing of micro-device 20, top side 24 (a top surface) of micro-device 20 can be substantially parallel (e.g., within manufacturing tolerances) to bottom side 26, source substrate surface 11, and the {100} crystal plane of source substrate 10. Source substrate 10 has a source substrate flat 18 (e.g., a wafer flat that provides a specified orientation and alignment for source substrate 10) that aligns with the {110} crystal plane of source substrate 10. According to some embodiments, micro-device edge 22 direction D is oriented at an angle from 0 to 90 degrees and more specifically 30 to 60 degrees with respect to the {110} crystal plane, for example substantially at 45 degrees. Thus, assuming that source substrate surface 11 is in an x and y plane and that a z axis is perpendicular to source substrate surface 11 and the x and y planes, micro-device 20 can generally be rotated about the z axis with respect to source substrate flat 18 and {110} crystal planes and, in some embodiments has a particular rotation relative to the z axis to have an edge at substantially 45 degrees to a {110}crystal plane. According to some embodiments, micro-device 20 has a micro-device length $L_M$ greater than a micro-device width $W_M$ and the direction of micro-device length $L_M$ is substantially parallel to the {100} crystal plane and can be oriented at an angle from 0 to 90 degrees with respect to the {110} crystal plane, for example substantially 45 degrees, e.g., in direction D. In some embodiments, micro-device 20 is rectangular. In some embodiments, micro-device 20 is square or has a non-rectangular shape.

Figure 2A:
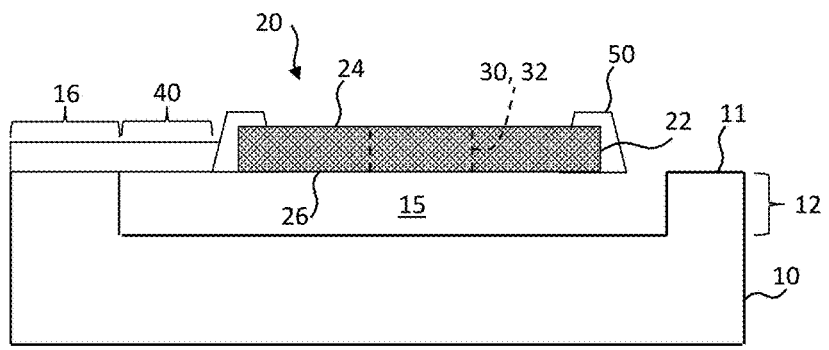
FIG. 2A is a schematic cross section of a micro-device on the source wafer after etching taken across cross-section line A of FIG. 1A according to illustrative embodiments of the present disclosure.
Figure 2B:
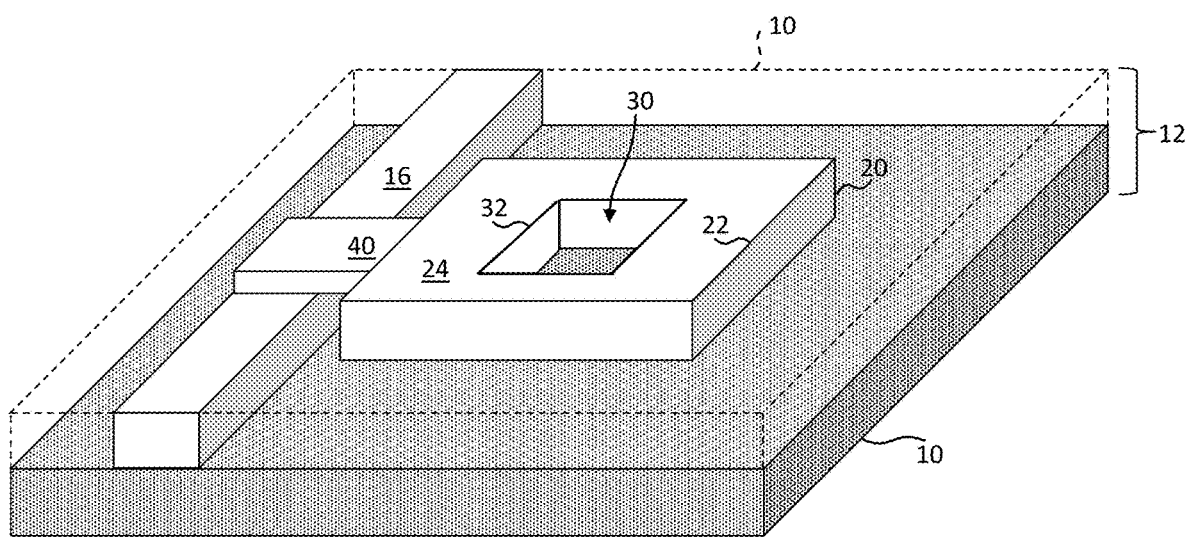
FIG. 2B is a schematic cut-away perspective of a micro-device on the source wafer corresponding to FIG. 2A according to illustrative embodiments of the present disclosure.

According to some embodiments of the present disclosure and as illustrated in FIGS. 1A-1D, etch hole 30 can be rectangular, can have an etch-hole edge 32, can have an etch-hole width $W_E$, or any combination of these. Etch hole 30 can have tapered side walls so that a top side (top opening) of etch hole 30 has a greater area than a bottom side (bottom opening) of etch hole 30 adjacent to source substrate 10. Tether 40 can have a tether width $W_T$ extending along an edge side 22 of micro-device 20 and connecting micro-device 20 to anchor portion 16. Etch-hole width $W_E$ can be greater than or no less than tether width $W_T$. By providing etch-hole width $W_E$ greater than or no less than tether width $W_T$, sacrificial portion 14 is more readily etched with an etchant beneath micro-device 20 so that micro-device 20 and tether 40 are undercut before the etchant significantly damages anchor portion 16, micro-device 20, or both, as shown in the cross section of FIG. 2A and perspective of FIG. 2B. According to some embodiments of the present disclosure and as illustrated in FIGS. 2A-2B, sacrificial portion 14 becomes a gap 15 (e.g., a cavity) formed by etching (e.g., wet etching or dry etching) or otherwise removing the material comprising sacrificial portion 14, so that micro-device 20 is suspended over source substrate 10 and is physically attached to source substrate 10 only by tether 40 connected to anchor portion 16 of source substrate 10. Micro-device 20 can then be micro-transfer printed (e.g., with an elastomeric stamp) from source substrate 10 to a target substrate 60, as illustrated in FIG. 4, discussed subsequently.

Where etch hole 30 and micro-device 20 are both substantially rectangular, etch hole 30 has an etch-hole edge 32, and micro-device 20 has a micro-device edge 22, etch-hole edge 32 can be substantially parallel to micro-device edge 22 (as shown in FIGS. 1A-2B). Etch hole 30 can have an etch-hole edge 32 with an etch-hole width $W_E$ in the range of 5 microns to 20 microns. According to some embodiments, micro-device 20 has a micro-device edge 22 in the range of 10 microns to 5 mm. For example, micro-device 20 can have a micro-device length $L_M$ no greater than 5 mm, 2 mm, 1 mm, 500 microns, 200 microns, 150 microns, or 100 microns.

Figure 3A:
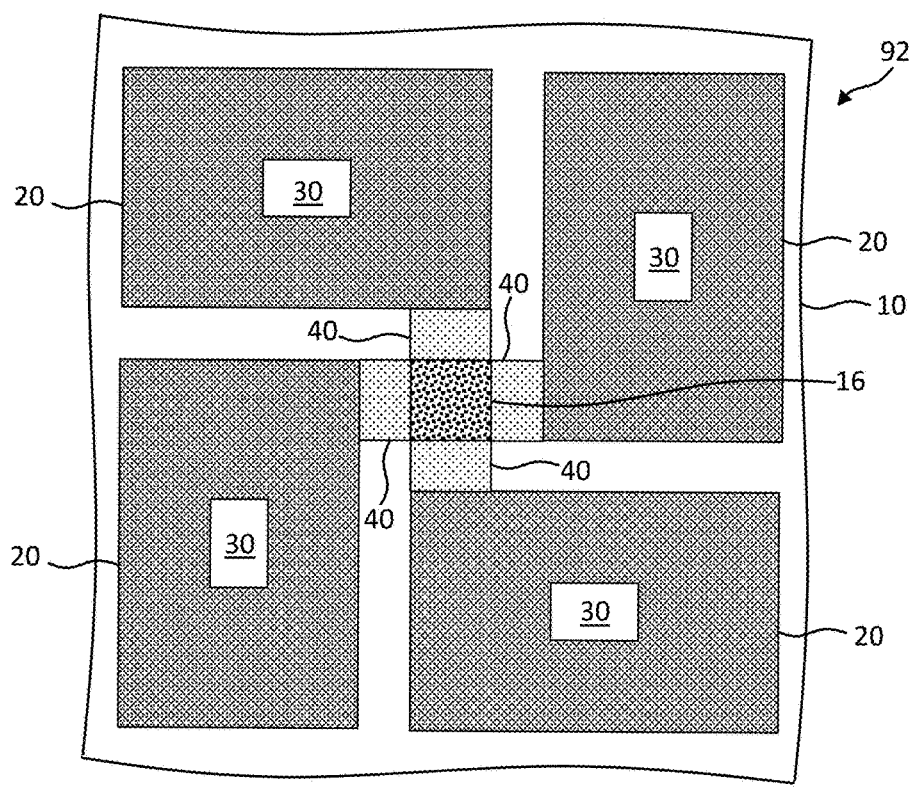
FIG. 3A is a schematic plan view of micro-devices on a source substrate according to illustrative embodiments of the present disclosure.
Figure 3B:
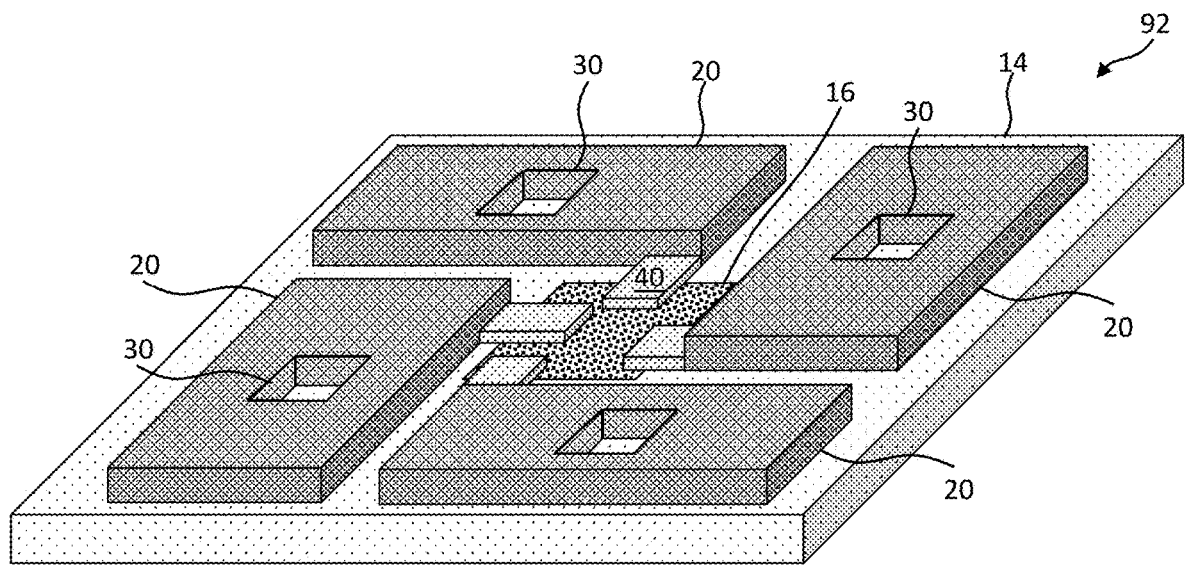
FIG. 3B is a perspective of a micro-device on a source substrate corresponding to FIG. 3A according to illustrative embodiments of the present disclosure.

Embodiments of the present disclosure can enable an efficient use of source substrate 10 area, reducing micro-device 20 manufacturing costs. According to some embodiments and as illustrated in the plan view of FIG. 3A and partial perspective of FIG. 3B, anchor portion 16 can be a central portion to which is physically attached multiple tethers 40 physically connecting corresponding micro-devices 20 with etch holes 30 over sacrificial portions 14. Each micro-device 20 and corresponding tether 40 physically connecting micro-device 20 to anchor portion 16 is a unit that is rotated with respect to all other units physically connected with tethers 40 to the same, common anchor portion 16. Since such a configuration and source substrate 10 layout can have smaller anchor portions 16, the arrangement illustrated in FIG. 3A can more efficiently use the area of source substrate 10, reducing manufacturing costs. That is, more of the area of source substrate 10 is devoted to micro-devices 20. Etch holes 30 enable a faster and more efficient release of micro-devices 20 in the configuration illustrated in FIGS. 3A and 3B from source substrate 10 for sacrificial portions 14 comprising an anisotropically etchable material, such as silicon {100}. Thus, according to embodiments of the present disclosure, a micro-device structure 92 comprises a source substrate 10 having a sacrificial layer 12 comprising sacrificial portions 14 adjacent to an anchor portion 16, micro-devices 20 disposed completely over each sacrificial portion 14, and a tether 40 that physically connects each micro-device 20 to anchor portion 16. Each micro-device 20 and corresponding physically connected tether 40 are rotated with respect to each other micro-device 20 and corresponding physically connected tether 40. In some embodiments, three micro-devices 20 are each physically connected to a common anchor portion 16 with a different tether 40. In some embodiments and as shown in FIGS. 3A and 3B, four micro-devices 20 are each physically connected to a common anchor portion 16 with a different tether 40 and are each rotated by 90 degrees from a neighboring micro-device 20. In some embodiments, micro-devices 20 and corresponding tether 40 are reflections of other micro-devices 20 and tether 40 (not shown in the Figures). In some embodiments, micro-devices 20 are square (e.g., have an aspect ratio of 1:1) and are not reflected or rotated but are physically connected by tethers 40 at different corners of micro-device 20 to anchor portion 60. As used in this context, at different corners also includes configurations in which tether 40 is physically connected to micro-device 20 closer to a corner of micro-device 20 than to a center or to another corner along the same edge of micro-device 20. Physically connecting tethers 40 to micro-devices 20 at the corners of micro-devices 20 as shown in FIGS. 3A and 3B can provide a denser configuration and better utilization of source substrate 10 surface area, but embodiments of the present disclosure are not limited to such configurations.

Figure 4:
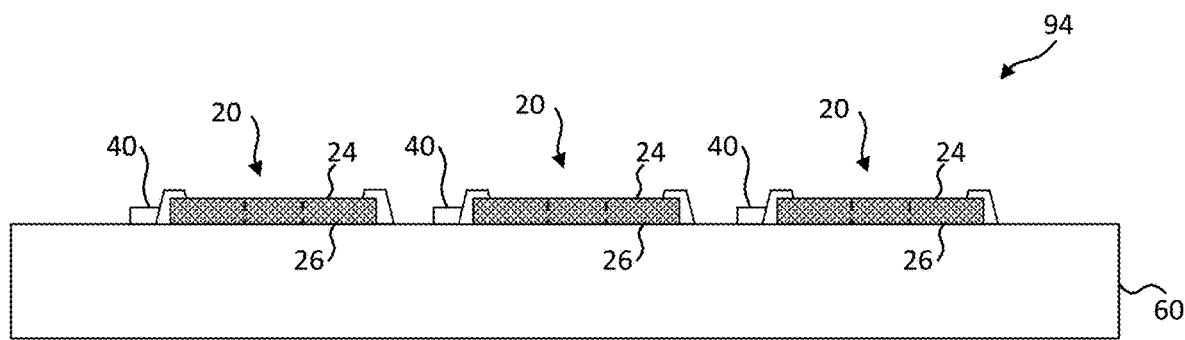
FIG. 4 is a cross section of micro-devices on a target substrate corresponding according to illustrative embodiments of the present disclosure.

According to some embodiments and as shown in FIG. 4, a micro-device structure 94 (e.g., a micro-transfer printed micro-device structure 92) comprises a target substrate 60 and a micro-device 20 (or multiple micro-devices 20) disposed on or over target substrate 60. Micro-device 20 can have a top side 24 and a bottom side 26 opposite top side 24. Bottom side 26 can be adjacent to target substrate 60 and top side 24 is on a side of micro-device 20 opposite target substrate 60. Each micro-device 20 can comprise an etch hole 30 that extends through micro-device 20 from top side 24 to bottom side 26. Etch hole 30 can expose target substrate 60 or a layer on target substrate 60 (e.g., an adhesive layer). Etch hole 30 can have tapered side walls so that a top side (top opening) of etch hole 30 has a greater area than a bottom side (bottom opening) of etch hole 30 adjacent to target substrate 60. A broken (e.g., fractured) or separated tether 40 can be physically connected to micro-device 20, for example as a consequence of micro-transfer printing micro-device 20 from source substrate 10 to target substrate 60. Etch hole 30 can have an etch-hole edge 32 with an etch-hole width $W_E$ in the range of 5 microns to 20 microns. Micro-device 20 can have a micro-device length $L_M$ no greater than 5 mm, 2 mm, 1 mm, 500 microns, 200 microns, 150 microns, or 100 microns. Micro-devices 20 on or over target substrate 60 can be coated with or encapsulated by, an encapsulating layer, for example a resin, planarizing material, silicon dioxide, or silicon nitride.

Figure 5:
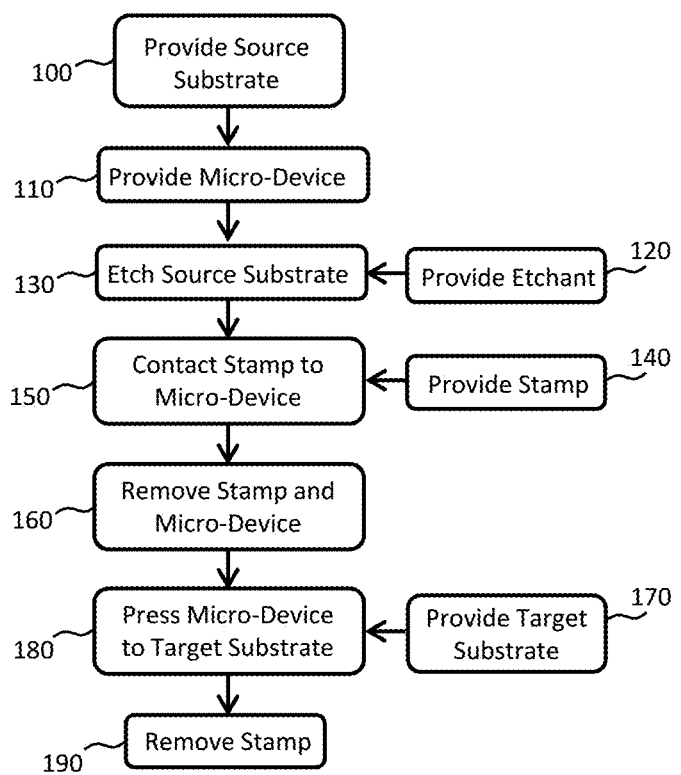
FIG. 5 is a flow diagram according to illustrative embodiments of the present disclosure.

According to some embodiments and as illustrated in the flow diagram of FIG. 5, a method of making a micro-device structure 90 comprises providing a source substrate 10 comprising a sacrificial layer 12 comprising a sacrificial portion 14 adjacent to an anchor portion 16 in step 100 and providing a micro-device 20 disposed completely over sacrificial portion 14 in step 110. Micro-device 20 can have a top side 24 opposite sacrificial layer 12 (or sacrificial portion 14) and a bottom side 26 adjacent to sacrificial layer 12 (or sacrificial portion 14) and can comprise etch hole 30 that extends through micro-device 20 from top side 24 to bottom side 26, exposing a portion of sacrificial portion 14. Tether 40 physically connects micro-device 20 to anchor portion 16. An etchant is provided in step 120, and sacrificial portion 14 is etched in step 130. At least the portion of sacrificial portion 14 exposed by etch hole 30 is etched by the etchant passing through etch hole 30, thereby forming gap 15 between micro-device 20 and source substrate 10, suspending micro-device 20 over source substrate 10, and forming a micro-device structure 90 as shown in FIGS. 2A and 2B. By forming gap 15 and suspending micro-device 20 over source substrate 10, micro-device 20 is rendered micro-transfer printable from source substrate 10. By etching through etch hole 30, sacrificial portion 14 material directly beneath micro-device 20 is etched and, accelerates removal of sacrificial portion 14 material (e.g., where slow-etching crystal planes of an anisotropic source substrate 10 (and sacrificial portion 14) are exposed) and reduces any damage to micro-device 20, tether 40, and anchor portion 16.

According to some embodiments and as illustrated in FIG. 4 and with reference further to FIG. 5, methods of the present disclosure can further comprise providing a stamp in step 140 and target substrate 60 in step 170, contacting micro-device 20 with the stamp to adhere micro-device 20 to the stamp in step 150, removing the stamp from source substrate 10 in step 160, thereby breaking (e.g., fracturing) or separating tether 40, pressing micro-device 20 to target substrate 60 in step 180 to adhere micro-device 20 to target substrate 60, and removing the stamp in step 190, forming a micro-device structure 92 as shown in FIG. 4.

In some embodiments of methods of the present disclosure, sacrificial portions 14 can be etched via wet etch, for example when exposed to a hot bath of tetramethylammonium hydroxide (TMAH) or potassium hydroxide (KOH) or any appropriate chemistry or a gaseous etch.

Figure 6:
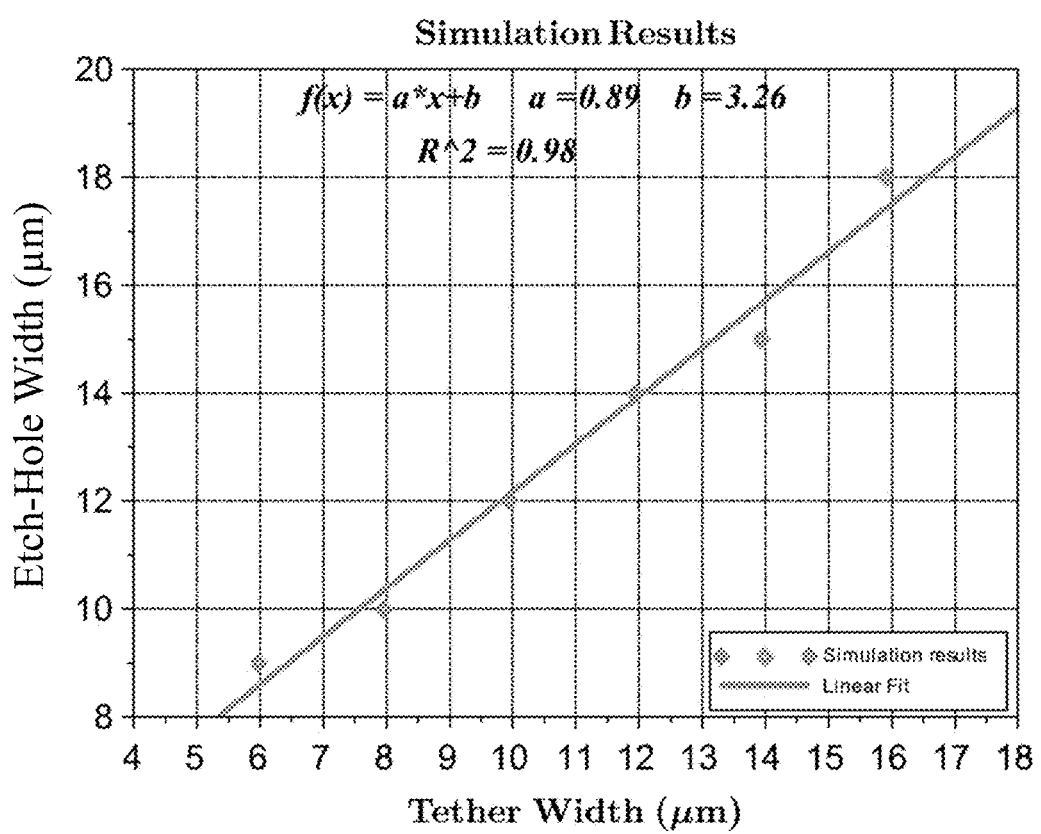
FIG. 6 is a graph illustrating release simulation results for various tether widths and etch-hole widths according to illustrative embodiments of the present disclosure.

Embodiments of the present disclosure have been modeled and their etching characteristics analyzed for tether widths $W_T$ varying from 6 to 16 microns, etch-hole width $W_E$ varying from 9-18 microns with various aspect ratios, anchor portion 16 having a polygonal cross section and diameters of 30-80 microns, and micro-devices 20 having micro-device lengths $L_M$ of 150 microns at various angles of micro-device edge 22 to source substrate flat 18 ranging from 0 to 90 degrees (e.g., including 0 degrees, 22.5 degrees, 45 degrees, 67.5 degrees, and 90 degrees). As shown in the graph of FIG. 6, etch holes 30 with an etch-hole width $W_E$ that is greater than a tether width $W_T$ of a tether 40 successfully release in an acceptable time period. The points graphed in FIG. 6 represent a simulated examples of embodiments that have a particular etch-hole width $W_E$ and tether width $W_T$ that were simulated to release in a single, same acceptable release time, each point representing a different combination of tether width $W_T$ and etch-hole width $W_E$. For example, a tether width $W_T$ of 8 μm and an etch-hole width $W_E$ of 10 μm can be used to release a micro-device 20 in an acceptable release time. Likewise, a tether width $W_T$ of 10 μm and an etch-hole width $W_E$ of 12 μm can be used to release a micro-device 20 in the same acceptable release time, as can a tether width $W_T$ of 12 μm and an etch-hole width $W_E$ of 14 μm. As can be seen from the simulated data plotted in FIG. 6, micro-device 20 can be released (e.g., to be micro-transfer printed) by etching for the chosen preferable acceptable release time when etch-hole width $W_E$ is greater than tether width $W_T$. In some embodiments, less desirable etch times are required for different combinations of tether widths $W_T$ and etch-hole widths $W_E$. An acceptable release time can be chosen based on, for example, commercial considerations (e.g., throughput) and/or a desired extent of release of (e.g., amount of etching under) micro-device 20 to be made (e.g., based on operational parameters of a subsequent micro-transfer printing to be performed).

Figure 7:
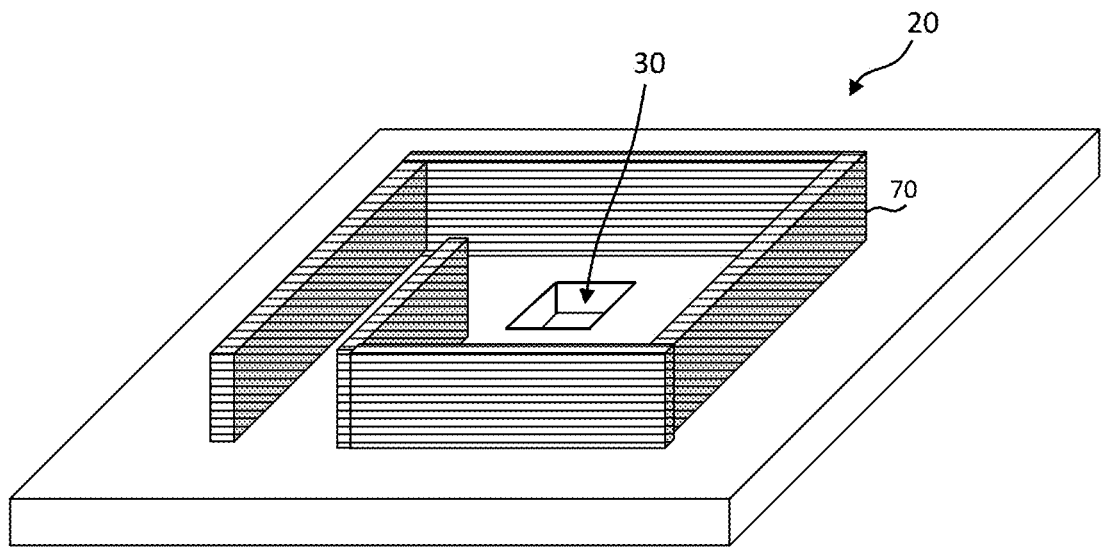
FIG. 7 is a perspective of an antenna micro-device according to illustrative embodiments of the present disclosure.
Figure 8:
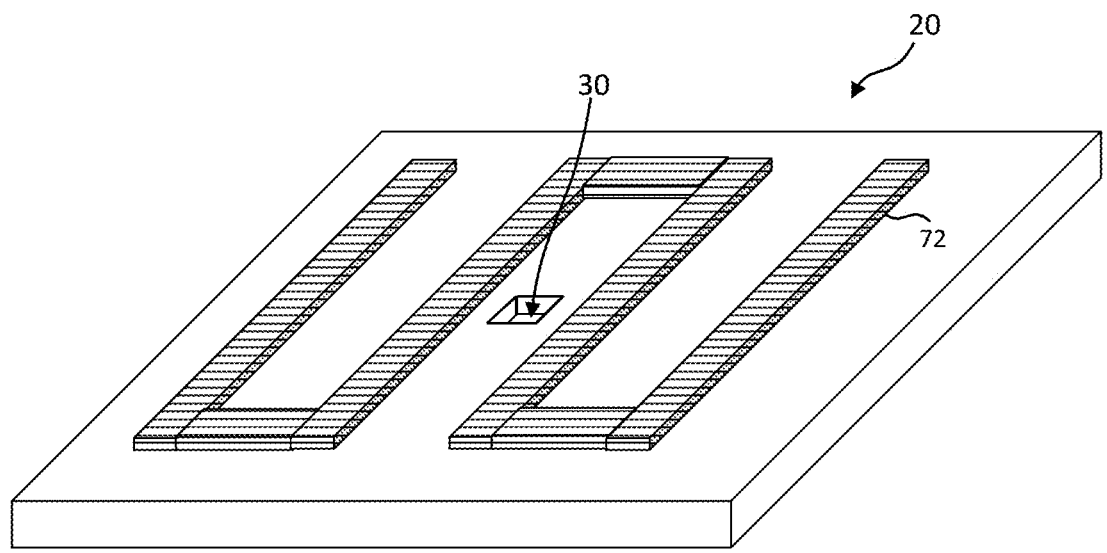
FIG. 8 is a perspective of a micro-heater micro-device according to illustrative embodiments of the present disclosure.
Figure 9:
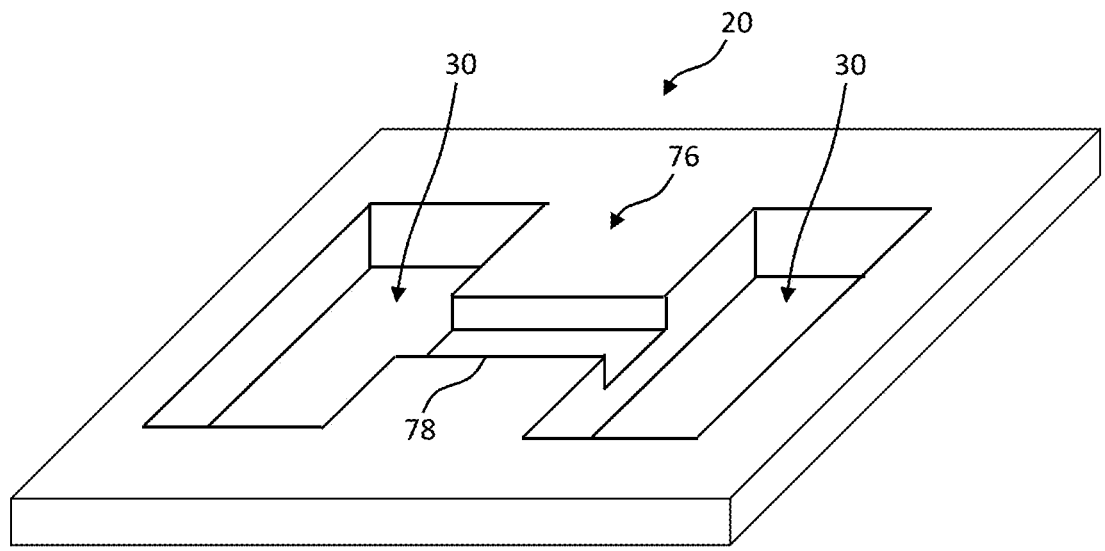
FIG. 9 is a perspective of a micro-fluidic reservoir structure micro-device according to illustrative embodiments of the present disclosure.
Figure 10:
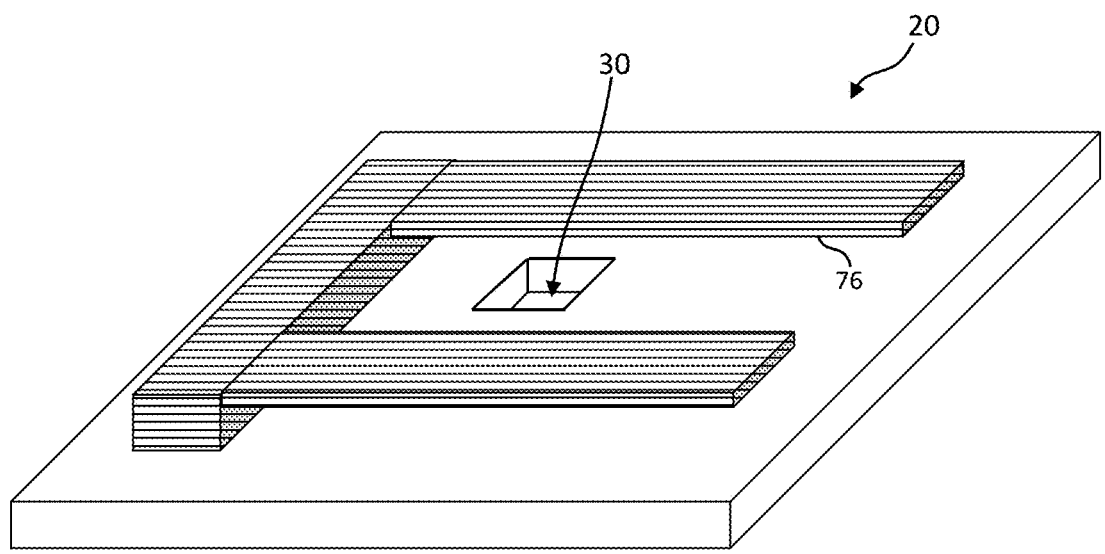
FIG. 10 is a perspective of a piezo-electric power micro-device according to illustrative embodiments of the present disclosure.

Micro-device 20 can be or can include, for example, any one or more of an electronic component, a piezoelectric device, an integrated circuit, an electromechanical filter, an acoustic resonator, an antenna, a micro-heater, a micro-fluidic structure for containing and constraining fluids, a micro-mechanical device, and a power source, for example a piezo-electric power source. In some embodiments of the present disclosure and as illustrated in FIG. 7, micro-device 20 is or comprises an antenna 70. Antenna 70 can be disposed around a periphery of micro-device 20 and can be a spiral antenna, can have a height greater than a width over a surface or substrate of micro-device 20. In some embodiments of the present disclosure and as illustrated in FIG. 8, micro-device 20 is or comprises a micro-heater 72, for example a strip micro-heater 72 comprising a resistive electrical conductor. In some embodiments of the present disclosure and as illustrated in FIG. 9, micro-device 20 is or comprises a micro- or nano-fluidic structure 74, for example comprising one or more etch holes 30 and one or more channels 78 for containing liquids that can flow or wick between etch holes 30 through channel(s) 78. A micro- or nano-fluidic structure 74 can further include one or more pumps, valves, or other fluid control elements. A micro- or nano-fluidic structure 74 can be an open surface structure or be enclosed. Etch holes 30 can act as an inlet or outlet for a micro- or nano-fluidic structure in addition to facilitating etching of sacrificial portion 14 material during micro-device 20 release. In some embodiments of the present disclosure and as illustrated in FIG. 10, micro-device 20 is or comprises a power device 76, for example a piezo-electric device with one or more beams (or cantilevers) that vibrate in response to mechanical stimulation and generate electrical power. More generally, embodiments of the present disclosure can be applied to micro-devices 20 that have space for etch hole 30, for example due to their size, shape, or layout.

Figure 11A:
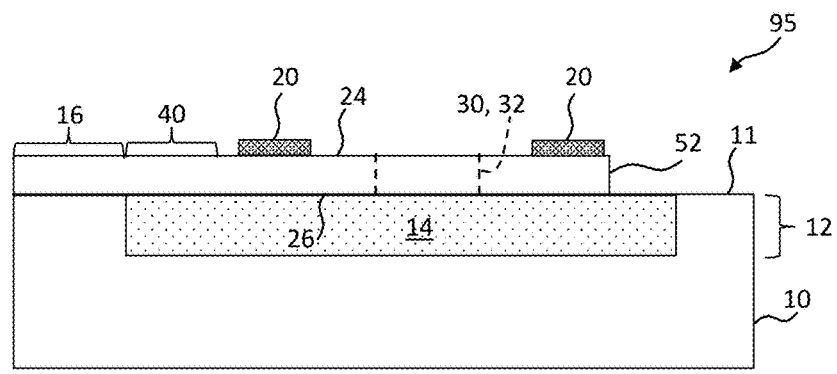
FIGS. 11A-B are a schematic cross section and perspective view, respectively, of an intermediate structure wafer according to illustrative embodiments of the present disclosure.
Figure 11B:
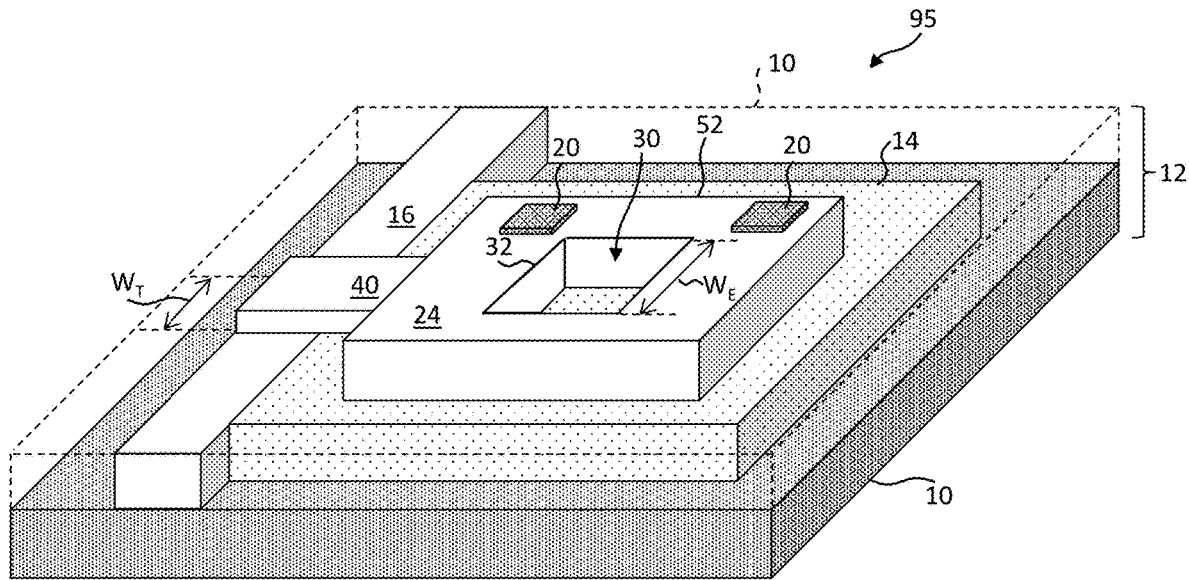

In some embodiments and as illustrated in FIGS. 11A-B, source substrate 10 is an intermediate structure 95 wafer. Source substrate 10 has sacrificial layer 12 comprising sacrificial portion 14. Intermediate substrate 52 is disposed completely over sacrificial portion 14. Intermediate substrate 52 has an etch hole 30 extending through intermediate substrate 52 from top side 24 to bottom side 26. One or more micro-devices 20 are disposed on intermediate substrate 52, for example on top side 24 thereof as shown. Micro-device(s) 20 can be non-native to intermediate substrate 52. Micro-device(s) 20 can be electronic, optical, or optoelectronic devices that can be electrically, optically, or both electrically and optically interconnected on intermediate substrate 52 (e.g., by wire(s) or trace(s) or light pipe(s)). One of micro-device(s) 20 can itself include an etch hole 30 that is disposed in alignment with etch hole 30 of intermediate substrate 52 such that etchant can flow through both. Given that intermediate substrate 52 is relatively large (e.g., at least 2×, at least 4×, or at least 10× larger than micro-device 20), etch hole 30 can assist in promoting fast and complete release of intermediate structure 95 from source substrate 10 such that intermediate structure 95 can be printed to target substrate 60. Intermediate structure 95 is connected to anchor portion 16 with tether 40 to maintain orientation and alignment of intermediate structure 95 after release. Tether 40 can be broken or separated to print intermediate structure 95. Methods of forming intermediate structures 95 that can be readily adapted to include etch holes 30 in intermediate substrates 52 are disclosed in U.S. Pat. No. 10,468,398, the disclosure of which is hereby incorporated by reference.

Although many figures presented herein often illustrate a single micro-device or intermediate substrate in a wafer for simplicity, one of ordinary skill in the art will appreciate that there will generally be many such micro-devices or such intermediate substrates disposed on a wafer (e.g., in a two-dimensional array).

Etch hole 30 can have an area relative to an area of micro-device 20 that is no greater than 10%, no greater than 5%, no greater than 1%, no greater than 0.5%, or no greater than 0.1%. For example, a micro-device 20 that has a micro-device length $L_M$ and micro-device width $W_M$ of 100 microns each and a square etch hole 30 of 10 microns on each etch-hole side, will have an etch hole area of 1%. For the simulated micro-device 20 having a micro-device length $L_M$ and micro-device width $W_M$ of 150 microns each and a square etch hole 30 of 10 microns on each etch-hole side, will have an etch hole area of 0.44%.

In some embodiments of the present disclosure, the etching process to remove sacrificial portions 14 of sacrificial layers 12 underneath releasable micro-devices 20 has a crystallographic dependence, etching faster in some directions of a crystal structure and slower in other directions of the crystal structure. Corner structures etch at different rates because of differences in the number of available dangling bonds that are susceptible to different etch rates. For example, in certain crystal structures and crystallographic orientations (e.g., with cubic symmetry and {100} orientation), an atom that is normally connected to four neighbors (e.g., in the bulk) may only be connected to two neighbors at a convex corner but would be connected to three neighbors at a concave corner due to the respective surface geometries of such corners. In certain crystal structures, a crystal atom normally connected to eight neighbors may only be connected to three neighbors at a convex corner but would be connected to seven neighbors at a concave corner. Therefore, convex or exterior corners of a crystalline structure(s) in sacrificial layer 12 etch relatively quickly, progressively etching and producing etch fronts to match the fast etching planes in the crystal, due to lower coordination (increased dangling bonds) for exposed atoms. Concave or internal corners of a crystalline structure(s) in sacrificial layer 12 have fewer susceptible dangling bonds and therefore etch more (relatively) slowly, forming a slowly moving or pinned/stopped etch front defined by the slowly etching planes (in many cases at a rate that is hardly measurable). Resulting etch fronts of the etchants can form and maintain a local shape characterized by the internal/concave corners. Some release layers (also referred to as a sacrificial layer 12) that exhibit this kind of crystallographic selectivity include Si {1 1 1}, Si {1 0 0}, InAlP, InP, GaAs, InGaAs, AlGaAs, GaSb, GaAlSb, AlSb, InSb, InGaAlSbAs, InAlSb, and InGaP.

Therefore, according to some embodiments of the present disclosure, the location, size, and shape of etch holes 30 can be chosen with regard to concave corners of micro-device 20 to reduce or eliminate formation of pinned etch front(s), which can inhibit micro-device 20 release. The effect of pinned etch front(s) can be even more significant when micro-devices 20 are large (e.g., no less than 100 µm in at least one dimension).

As shown in FIGS. 1B and 1D-3B, micro-devices 20 can be attached to anchor portion 16 (anchor 16) by tether 40 (e.g., a single tether 40). In order to enable effective pick-up (e.g., by a stamp for micro-transfer printing), tether 40 has a tether width $W_T$ along an edge of micro-device 20 that is less than a length of the edge of micro-device 20 (e.g., as shown in FIG. 1D). Tether 40 therefore forms a concave corner with micro-device 20, inhibiting etching under micro-device 20 and under tether 40. According to embodiments of the present disclosure, micro-device 20 comprises or has a concave corner if tether 40 contacts (e.g., touches or intersects) micro-device 20 and tether 40 has a width $W_T$ along an edge of micro-device 20 that is less than the length of the edge of micro-device 20. Furthermore, if multiple tethers 40 physically connect micro-device 20 to anchor portion 16, multiple concave corners are present.

In some embodiments in which micro-devices 20 are not intended for transfer printing, tether 40 can serve as a cantilever attached to micro-device 20, for example if tether 40, micro-device 20, or both, form a piezoelectric device and micro-device 20 is designed to oscillate vertically with respect to a surface of source substrate 10 (source wafer 10). In some such embodiments, tethers 40 can also form concave corners with micro-device 20. Likewise, in some embodiments in which tethers 40 are intended to etch entirely away so that micro-devices 20 fall into gap 15 or fall away from source substrate 10 (e.g., for subsequent transfer and/or collection), tethers 40 form concave corners with micro-devices 20.

Figure 12:
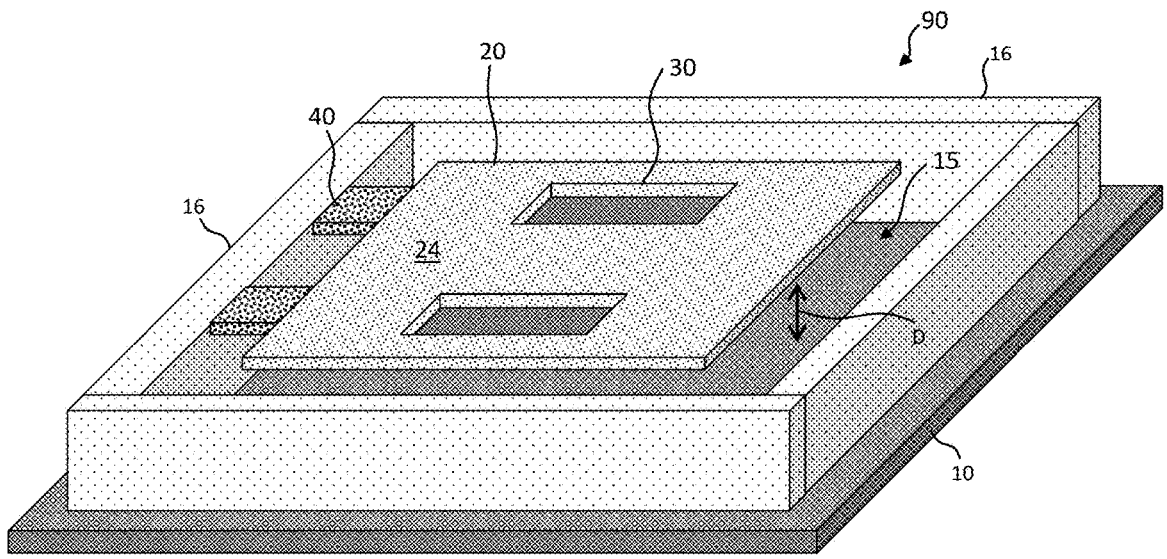
FIG. 12 is a perspective of a micro-device structure having two or more tethers and two or more etch holes suspended over a source wafer according to illustrative embodiments of the present disclosure.
Figure 13:
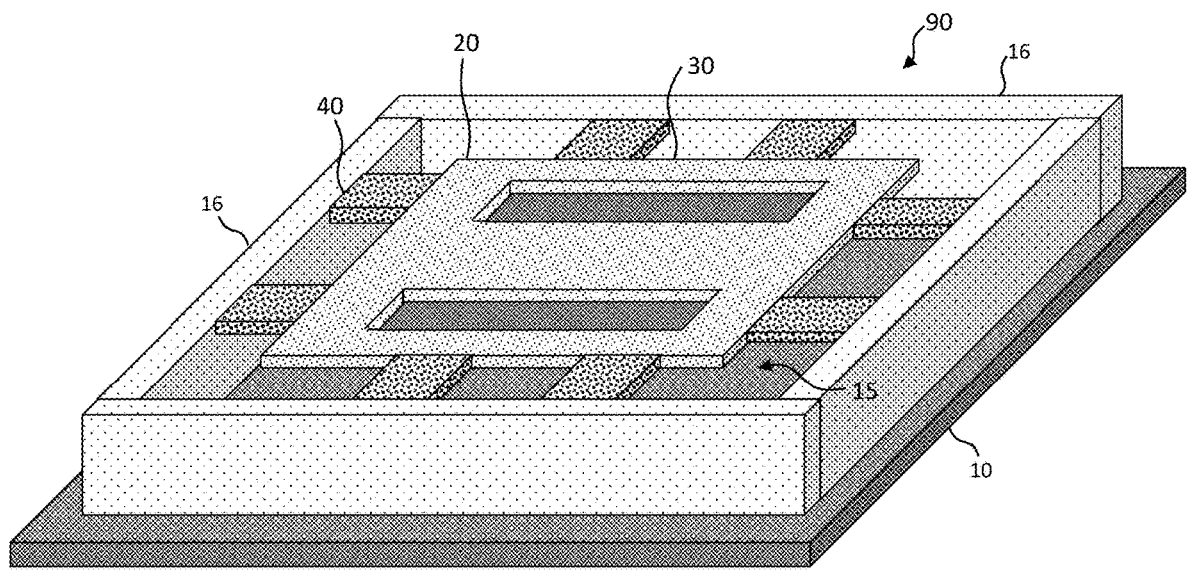
FIG. 13 is a perspective of a micro-device structure having two or more tethers on each edge side of a rectangular micro-device and two or more etch holes suspended over a source wafer according to illustrative embodiments of the present disclosure.

Embodiments of the present disclosure illustrated in FIGS. 1A-3B, 7, 8, and 10 illustrate micro-devices 20 with a single etch hole 30 and a single tether 40. FIG. 12 illustrates micro-device structure 90 with micro-device 20 attached to anchor portion 16 with two tethers 40. FIG. 13 illustrates micro-device structure 90 with micro-device 20 attached to anchor portion 16 with two tethers 40 on each edge side 22 of rectangular micro-device 20. Multiple tethers 40 can prevent micro-device 20 from contacting source substrate 10, even though micro-device 20 is suspended over gap 15 by a distance D, especially where micro-device 20 is relatively large or has a large aspect ratio (e.g., forms a thin rectangle). In both FIG. 12 and FIG. 13, two etch holes 30 extend through micro-device 20 from top side 24 of micro-device 20 to bottom side 26 of micro-device 20 (not shown in FIGS. 12 and 13, see FIG. 11A). Bottom side 26 is adjacent to and exposes source substrate 10 or a sacrificial portion 14 (e.g., as shown in FIGS. 11A and 11B) or gap 15 (e.g., as shown in FIGS. 12 and 13).

According to some embodiments of the present disclosure, micro-devices 20 can have etch holes 30 with a large aspect ratio, for example no less than 2:1, 3:1, 5:1, 10:1, 20:1, or even 50:1. Such embodiments of high-aspect-ratio etch holes 30 can provide ingress to etchants attacking fast-etching crystal planes in areas that would otherwise etch last or would cause undesired long etch processes. Larger aspect ratios can expose greater fast-etch plane area for an equivalent etch hole 30 size (e.g., to balance etch rate and usable micro-device 20 area). Etching directly underneath relatively large micro-devices 20, for example micro-devices 20 that are no less than 100 microns in length or width (e.g., both) (e.g., no less than 200 microns in length or width, no less than 500 microns in length or width, no less than 750 microns in length or width, no less than 1 mm in length or width, or even larger in length or width) can then be accelerated or timed accordingly to ensure structural support throughout the release process. High-aspect-ratio etch holes 30 can be oriented with respect to the crystallographic structure and orientation of source wafer 10, e.g., as illustrated and discussed with respect to FIG. 1A. Etch holes 30 with a high (large) aspect ratio (e.g., a large ratio of length to width where length is greater than width) can expose a greater portion of a desired etch plane while reducing the total area of etch holes 30 (e.g., to maintain the structural integrity of micro-device 20). In some embodiments, mass is added to micro-device 20 to compensate for the loss of mass in micro-device 20 from etch holes 30.

Figure 14:
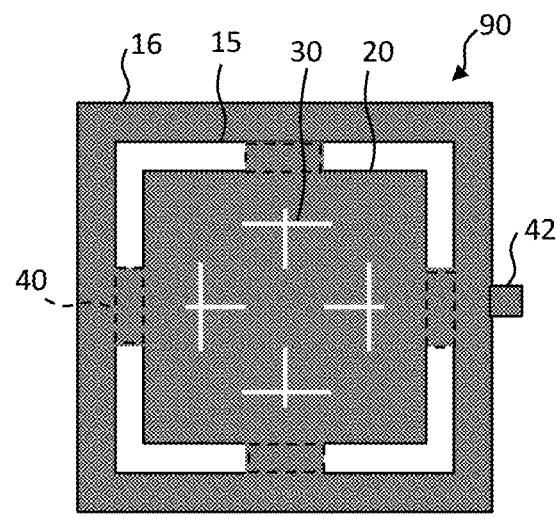
FIG. 14 is a plan view of a micro-device structure having one tether on each edge side of a rectangular micro-device and four etch holes with extended arms according to illustrative embodiments of the present disclosure.
Figure 16:
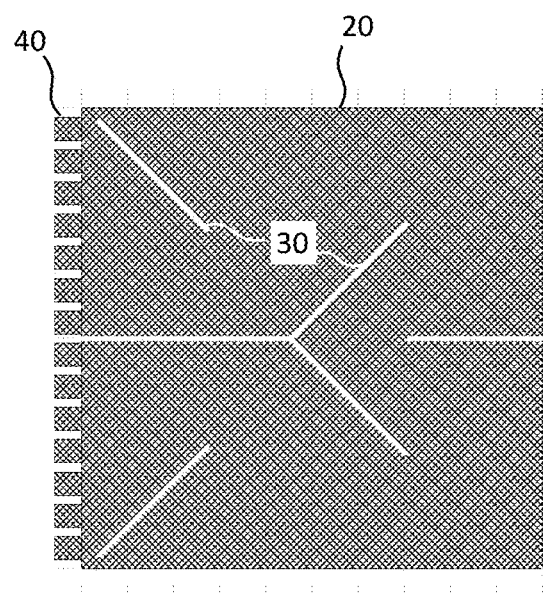
FIGS. 16-18 are plan views of a micro-device with multiple tethers on a single edge side of the micro-device and multiple high-aspect-ratio etch holes according to illustrative embodiments of the present disclosure.
Figure 15A:
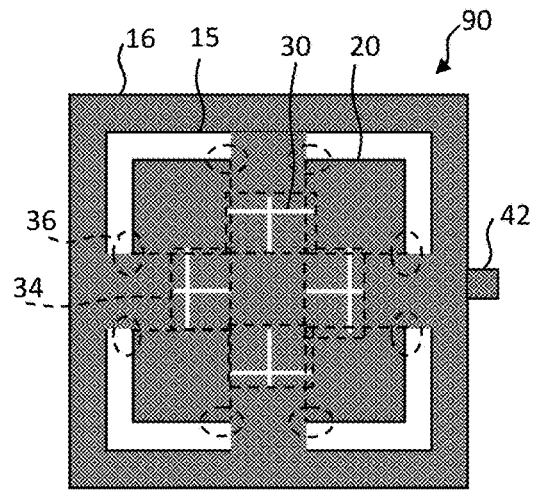
FIG. 15A is a plan view of the micro-device structure of FIG. 14 indicating some pinned etch fronts and concave corners.
Figure 15B:
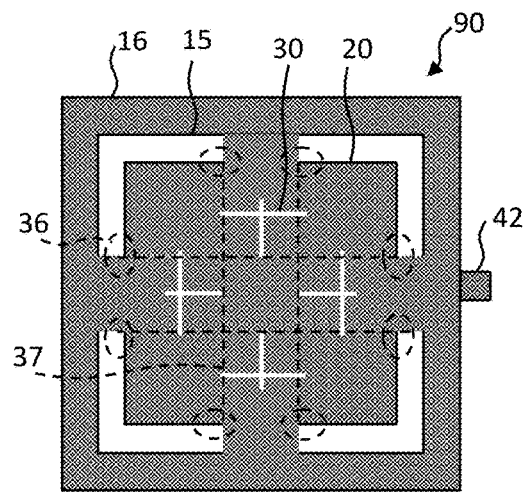
FIG. 15B is a plan view showing straight line segments.
Figure 15C:
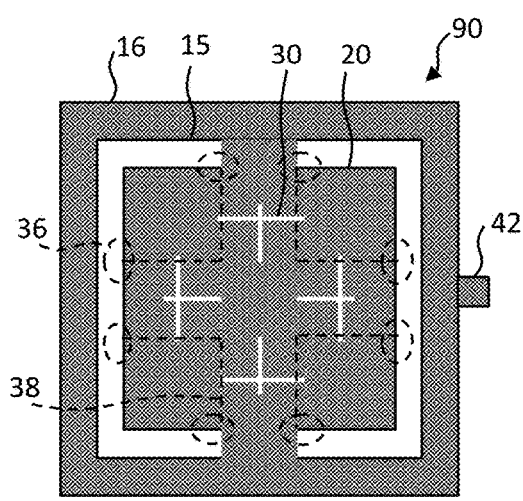
FIG. 15C is a plan view showing orthogonal line segment angles according to illustrative embodiments of the present disclosure.
Figure 17:
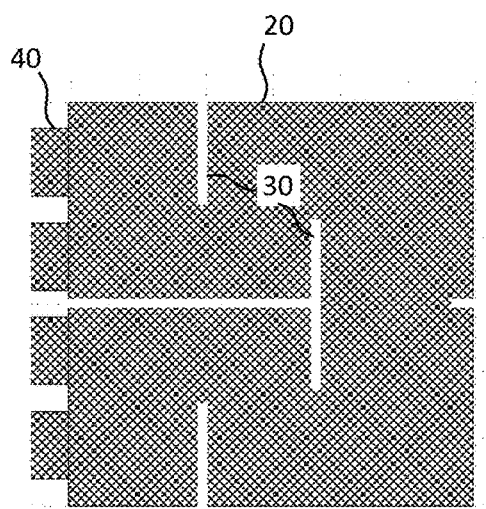
Figure 18:
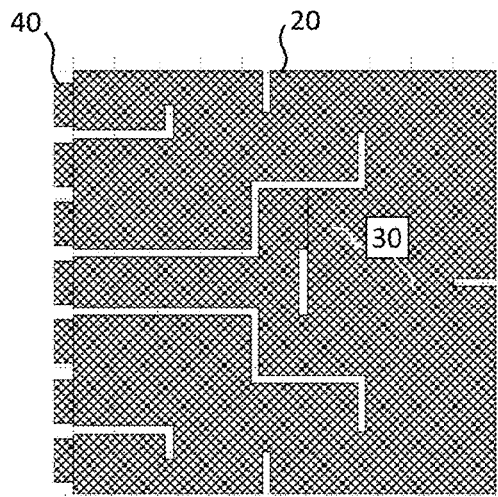
Figure 19:
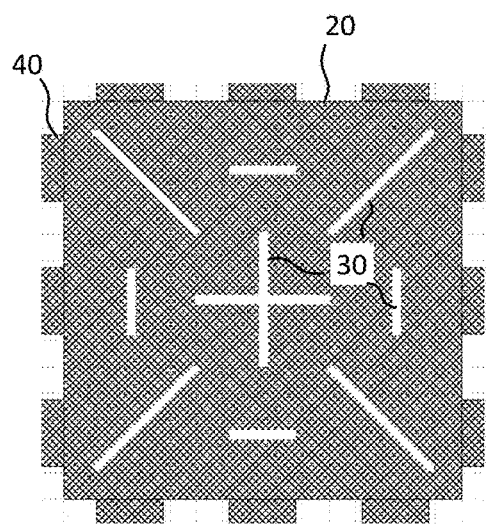
FIGS. 19-20 are plan views of a micro-device with multiple tethers on multiple edge sides of the micro-device and multiple high-aspect-ratio etch holes according to illustrative embodiments of the present disclosure.
Figure 20:
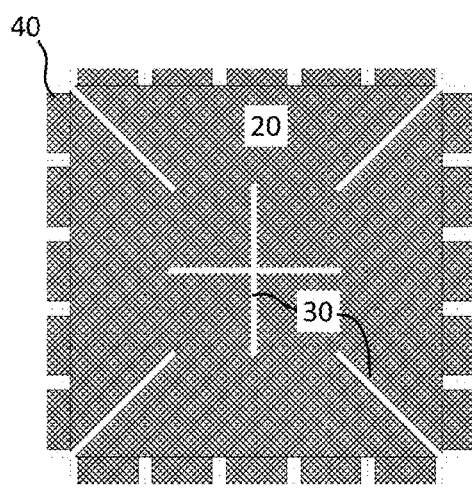

FIGS. 14 and 15 illustrate micro-device structures 90 with micro-devices 20 and four high-aspect-ratio etch holes 30. In FIGS. 14 and 15A-15C, etch holes 30 can each comprise two crossing line segments forming extended arms of a common single etch hole 30 that each have a much greater length than width. As used herein, line segments are high-aspect-ratio rectangles where length is the longer dimension and width is the shorter dimension of each line segment in a direction parallel to top side 24. As used herein, a single etch hole 30 comprising two or more connected line segments is considered a high-aspect-ratio etch hole 30 because each of the two or more connected line segments have a large aspect ratio. Thus, according to some embodiments of the present disclosure, a micro-device structure 90 comprises a micro-device 20 having a top side 24 and a bottom side 26 and one or more etch holes 30. Each of the one or more etch holes 30 is an etch hole 30 that extends through micro-device 20 from top side 24 to bottom side 26 so that, for example, an etchant can flow through the etch holes 30. One or more tethers 40 physically connect micro-device 20 to anchor portion 16. At least one etch hole 30 has an aspect ratio no less than 2:1.

According to some embodiments, micro-device 20 can be disposed over and native to source substrate 10. Source substrate 10 can comprise a sacrificial layer 12 comprising anchor portions 16 laterally separated by sacrificial portions 14 in a direction parallel to a surface of source substrate 10 or top side 24, as shown in FIGS. 11A and 11B. Anchor portions 16 can be a part of source substrate 10 or a structure disposed on source substrate 10. According to some embodiments, micro-device structure 90 is disposed on a target substrate 60 or intermediate substrate 52 (e.g., as shown in FIG. 4, for example by micro-transfer printing). Target substrate 60 or intermediate substrate 52 can comprise a gap 15 (or cavity 15) beneath micro-device 20. In some embodiments, gap 15 and tether 40 enable micro-transfer printing micro-device 20 from source wafer 10. In some embodiments, gap 15 between micro-device 20 and source, target, or intermediate substrate 10, 60, 52 provides room for micro-device 20 to physically move, for example oscillate or vibrate in a direction orthogonal to top side 24, in embodiments in which tether 40 provides a cantilever for micro-device 20, for example if tether 40 or micro-device 20, or both, comprise a piezoelectric device comprising piezoelectric material, e.g., an acoustic filter or power generator. In some such embodiments, micro-device 20 can be or include a mass at the distal end of a cantilever (tether 40) that mechanically stresses the piezoelectric material to generate electrical power when mechanically perturbed (e.g., by shaking or otherwise accelerating micro-device 20).

Figure 22:
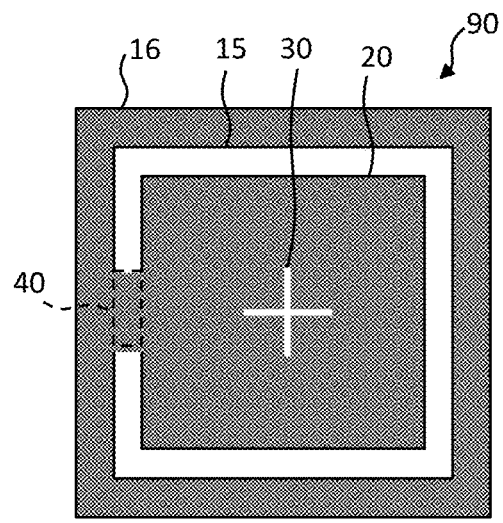
FIGS. 22-23 are plan views of micro-device structures having a single etch hole with extended arms according to illustrative embodiments of the present disclosure.
Figure 23:
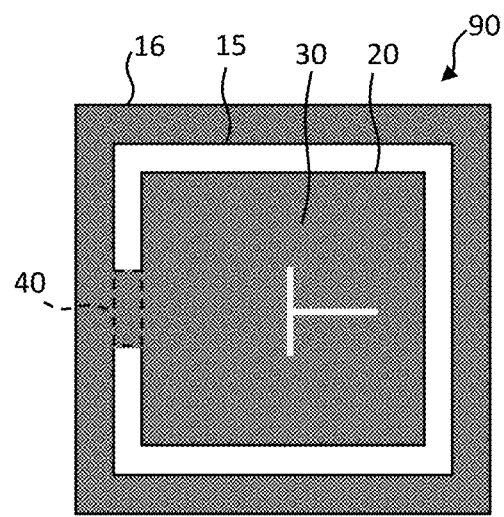

As will be appreciated by those knowledgeable in crystallography and etching processes, a wide variety of etch holes 30, especially high-aspect-ratio etch holes 30, can be disposed in micro-device 20. FIGS. 14 to 23 illustrate a variety of etch hole 30 arrangements with respect to a variety of tethers 40, for example a single tether 40 on a single edge side 22 of micro-device 20 (e.g., as shown in FIGS. 22 and 23), two or more tethers 40 (e.g., as shown in FIGS. 12-21C), two or more tethers 40 on a single edge side 22 of micro-device 20 (e.g., as shown in FIGS. 12 and 16-18), one tether 40 per micro-device 20 edge side 22 (e.g., as shown in FIGS. 14 and 15), or two or more tethers 40 per micro-device 20 edge side 22 (e.g., as shown in FIGS. 13, 19-21C).

According to some embodiments of the present disclosure, etch holes 30 can be disposed in micro-device 20 so as to reduce the time required to under-etch micro-device 20 and completely release it from its native source wafer 10. Locations at which an etch front can be pinned (e.g., stopped), hard to reach by wet chemicals, or greatly slowed compared to etching along fast-etching planes, are illustrated as pinned etch fronts 34 (pinned etch planes 34) with dashed straight lines or rectangular boxes in FIGS. 15 and 21B and extend from concave corners 36. Etch holes 30 are disposed to contact (e.g., touch or intersect) or overlap pinned etch planes 34 so that etchant can attack pinned etch planes 34 from a different fast-etching plane direction and thus etch otherwise pinned etch planes 34. FIGS. 15A and 21B illustrate the overlap of etch holes 30 and pinned etch planes 34 associated with each individual etch hole 30. Because pinned etch planes 34 associated with etch holes 30 overlap, each pinned etch plane 30 can be etched from a different non-pinned (e.g., fast etching) plane, resulting in complete under-etching (release) of micro-device 20 (e.g., within a commercially practical time frame, such as two hours, one hour, 30 minutes, or 15 minutes). In FIG. 21B, the pinned etch planes 34 resulting from concave corners 36 at the juncture of tethers 40 and micro-device 20 are not marked but are interrupted by diagonal etch holes 30 at 45 degrees to a micro-device 20 edge side 22 and the extended arm of plus-shaped etch holes 30 extending orthogonally to edge side 22 of micro-device 20.

Etch holes 30 can expose fast-etching planes at otherwise pinned etch plane 34 locations and can also be disposed in micro-device 20 to increase the etch rate and decrease the etch time even if no pinned etch planes 34 are present. In some cases, no or few concave corners 36 are present, but micro-device 20 is sufficiently large that is desirable to accelerate the release process to avoid damage to micro-device 20, tether 40, or anchor portion 16 since, if the wet etch rates are too high, the etchant can also damage micro-device 20, tether 40, or anchor portion 16 as the etching selectivity between the sacrificial layer and other materials is generally not infinite.

According to some embodiments of the present disclosure, etch holes 30 can be rectangular (e.g., as shown in FIGS. 12 and 13) and can have a large aspect ratio, for example a length to width ratio of no less than 2:1, no less than 4:1, or no less than 8:1. An etch hole 30 can comprise connected line segments, where each line segment is a rectangle with a large aspect ratio, for example forming plus ('+') sign shapes, X ('X') shapes, cross shapes, Y ('Y') shapes, and T ('T') shapes. A combination of connected line segments or other rectangular or curved line segments forms a single etch hole 30. In some embodiments, etch hole 30 can be disposed near or substantially at or intersecting a geometric center of micro-device 20.

Etch holes 30 can also be disposed in micro-device 20 so as to progressively etch sacrificial portion 14 in a desired temporal progression. Etching sacrificial portion 14 to form gap 15 can result in etch byproducts such as gases that form bubbles that mechanically perturb micro-device 20 and tether 40, possibly undesirably cracking tether 40 or micro-device 20. Thus, it can be helpful, in some embodiments of the present disclosure, to progressively etch sacrificial portion 14 so that micro-device 20 and tether 40 are supported (not completely undercut) until most of the etching process is complete, thus providing mechanical support for micro-device 20 and tether 40 during most of the etching process. Once most of the etching process is complete, the remainder of the etch can be relatively small and therefor relatively gentle, thus preserving the structural integrity of micro-device 20 and tether 40 during the under-etching process.

In order to ensure that micro-devices 20 are released despite any pinned etch fronts resulting from any concave corners 36 of micro-device 20 and according to embodiments of the present disclosure and as illustrated in FIG. 15B, etch holes 30 are disposed in micro-device 20 so that any straight line 37 parallel to an edge side 22 of micro-device 20 drawn from a concave corner 36 on a first edge side 22 of micro-device 20 to a second edge side 22 of micro-device 20 opposite the first edge side 22 contacts (e.g., touches or intersects) an etch hole 30. As used herein with respect to etch hole 30 and micro-device 20 geometry, "a side" (or "any side") of micro-device 20 (without reference to its particular location) is also an edge side 22 of micro-device 20 and does not include top side 24 or bottom side 26 of micro-device 20 (which are specifically referred to by their location—top and bottom, respectively). This requirement is particularly (but not exclusively) useful where tethers 40 are attached to micro-device 20 on a single edge side 22 of micro-device 20 (e.g., as shown in FIGS. 12, 14-18, and 22-23. Micro-devices 20 can have a polygonal perimeter (e.g., a rectangular perimeter) and edge sides 22 of micro-device 20 can have a shape of a line segment that is a portion of the polygonal perimeter.

Similarly, in order to ensure that micro-devices 20 are released despite any pinned etch fronts 34 resulting from any concave corners 36 of micro-device 20 and according to embodiments of the present disclosure and as illustrated in FIG. 15C, etch holes 30 are disposed in micro-device 20 so that any orthogonal line segment angle 38 drawn from a first concave corner 36 on a first edge side 22 of micro-device 20 to a second concave corner 36 on a second edge side 22 of micro-device 20 adjacent to the first edge side 22 contacts (e.g., touches or intersects) an etch hole 30. Adjacent edge sides 22 of micro-device 20 are edges side 22 that contact each other, e.g., at a corner (whether concave or convex). An orthogonal line segment angle 38 comprises two line segments that contact each other at an end of each line segment and that extend orthogonally (at right angles) to each other, thus forming a corner, e.g., two adjacent sides of a square or rectangle. This requirement can be particularly (but not exclusively) useful where tethers 40 are attached to micro-device 20 on each edge side 22 of micro-device 20 (e.g., as shown in FIGS. 13, 14-15, and 19-21C.

According to embodiments of the present disclosure, an etch hole 30 has two or more portions (e.g., line segments or high-aspect-ratio line segments) that extend in different directions (e.g., orthogonally forming plus, X, Y, cross, or T shapes) and is disposed closer to a center of micro-device 20 than to any edge side 22 of micro-device 20. In some embodiments, etch hole 30 intersects or is disposed at a center of micro-device 20, e.g., as shown in FIGS. 22-23 and also FIGS. 15-17, 19-21C. In some such embodiments, etch hole 30 can be the only etch hole 30 in micro-device 20 (e.g., a singular etch hole 30) as shown in FIGS. 22 and 23.

Etch holes 30 can be disposed in such a way that they do not cut micro-device 20 into physically separate portions, e.g., micro-device 20 is a unitary and contiguous micro-device 20 despite etch holes 30 disposed through micro-device 20. According to some embodiments, one or more etch holes 30 extend to an edge of micro-device 20 (e.g., intersect an edge of micro-device 20 as shown in FIGS. 15, 17, 19, 21A-21C). According to some embodiments, etch holes 30 do not extend to an edge of micro-device 20 (e.g., as shown in FIGS. 12-15, 19, 20, 22, 23). In some embodiments, at least one etch hole 30 is disposed at an angle that is not parallel or orthogonal to an edge side 22 of micro-device 20 (for example disposed on a diagonal such as a 45 degree diagonal with respect to edge sides 22 of micro-device 20 as shown in FIGS. 16, 19-21C).

Figure 24:
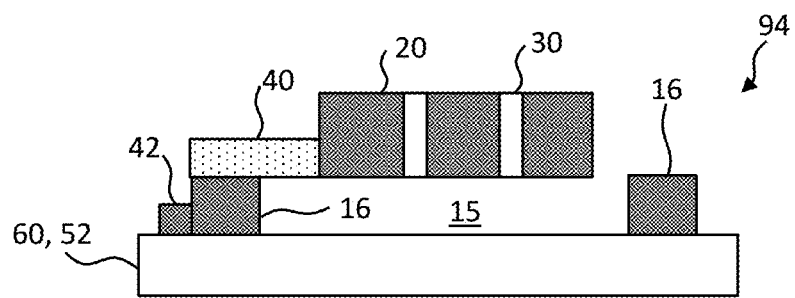
FIG. 24 is a cross section of a micro-device system according to illustrative embodiments of the present disclosure.

In some embodiments, anchor portion 16 surrounds micro-device 20 in a horizontal direction (e.g., parallel with or in a plane defined by top side 24 of micro-device 20 or by a surface of source substrate 10 or target substrate 60) as shown in the plan views of FIGS. 12-15, 22-23 and cross section of FIG. 24.

According to some embodiments of the present disclosure, micro-device structure 90 comprises a source wafer 10 (e.g., a native source wafer 10) and anchor portion 16 is disposed on or is a portion of source wafer 10 and micro-device 20 is separated from source wafer 10 by cavity 15 (gap 15) or sacrificial portion 14. Source wafer 10 can have a crystalline structure that is anisotropically etchable. Source substrate can comprise silicon, e.g., silicon {100} or silicon {111}. In some embodiments, source substrate 10 has a crystalline structure with a {100} orientation and bottom side 26 of micro-device 20 is substantially parallel to a {100} crystal plane at a surface of source substrate 10. In some embodiments, micro-device 20 has a micro-device edge direction oriented at an angle from 30 to 60 degrees with respect to a {110} crystal plane of the crystalline structure. In some embodiments, micro-device 20 comprises a micro-device edge having a direction oriented at an angle of substantially 45 degrees with respect to the {110} crystal plane. In some embodiments, source substrate 10 has a crystalline structure with a {100} crystal plane, micro-device 20 has a micro-device length greater than a micro-device width and the micro-device length is in a direction that is substantially parallel to the {100} crystal plane.

According to some embodiments of the present disclosure, micro-device structure 90 comprises a micro-device 20 and one or more etch holes 30, micro-device 20 and at least one etch hole 30 are both rectangular, etch hole 30 has an etch-hole edge, micro-device 20 has a micro-device edge, and the etch-hole edge is substantially parallel, substantially orthogonal, or substantially at 45 degrees to the micro-device edge. By orienting the etch-hole edge at such angles to the micro-device edge and orienting the micro-device edge with respect to the native source substrate 10 crystal structure, fast etch planes in native source substrate 10 can be exposed by etch-holes 30. According to embodiments of the present disclosure, etch hole edges or line segments are disposed substantially parallel, substantially perpendicular, substantially at 30 degrees, or substantially at 40 degrees with respect to the wafer flat. By substantially is meant as designed or within manufacturing limitations.

According to some embodiments of the present disclosure and as illustrated in FIG. 24, micro-device structure 90 can be micro-transfer printed from native source substrate 10 to a target or intermediate substrate 60, 52. In some such embodiments, a micro-device system 94 comprises a target or intermediate substrate 60, 52, one or more micro-device structures 90 disposed on target or intermediate substrate 60, 52, and a broken (e.g., fractured) or separated structure tether 42 physically attached to anchor portion 16. FIGS. 14 and 15 illustrate structure tethers 42 attached to anchor portions 16. Such embodiments can integrate micro-device structures 90 into electronic micro-device systems 94 for a variety of applications.

Figure 25A:
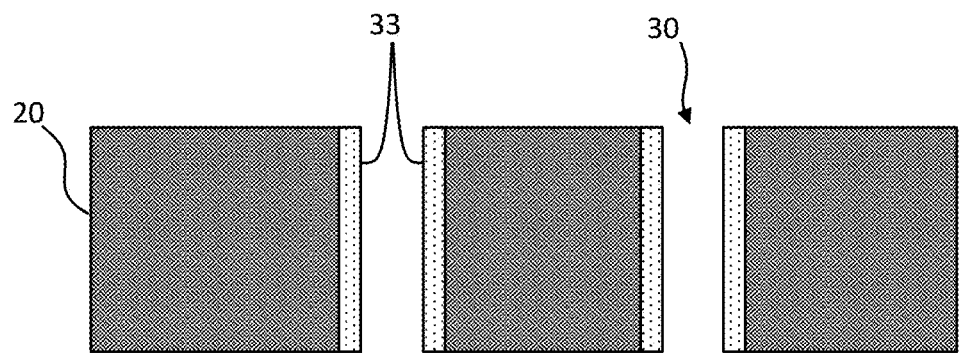
FIGS. 25A and 25B are cross sections and FIG. 25C is a plan view with a detail of an etch hole with an etch hole protective coating in a micro-device system according to illustrative embodiments of the present disclosure.
Figure 25B:
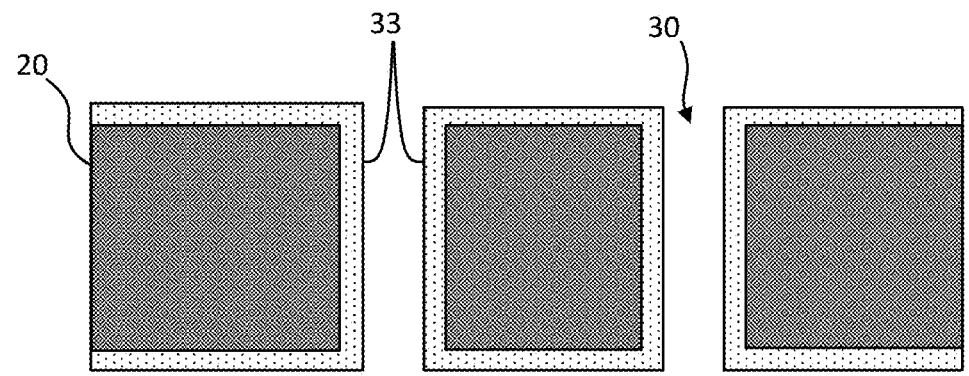
Figure 25C:
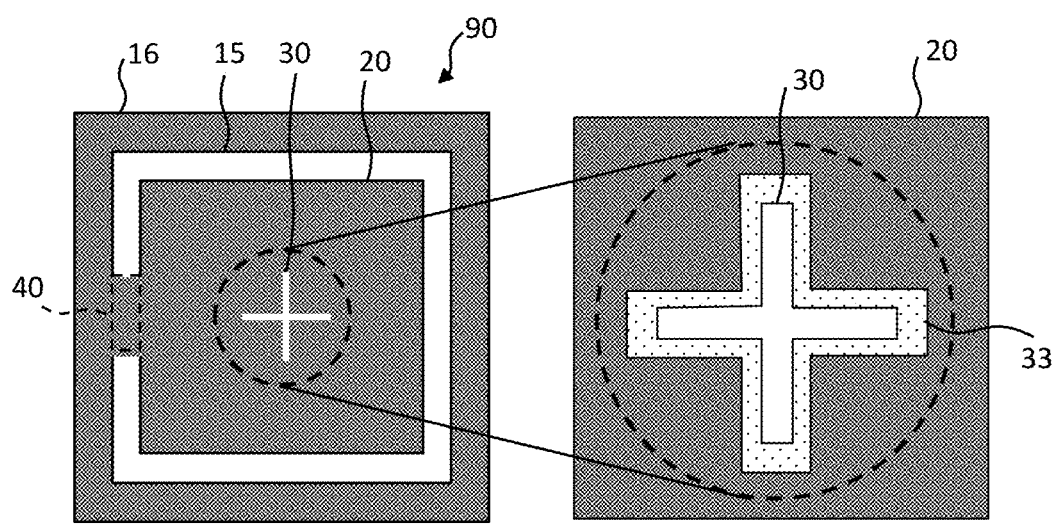

According to some embodiments of the present disclosure and as illustrated in the cross sections of FIGS. 25A and 25B and the plan view and detail of FIG. 25C, etch holes 30 in micro-devices 20 can be coated with an etch-hole protective coating 33 that is relatively impervious to an etchant that etches sacrificial portion 14, e.g., as shown in FIGS. 25A and 25C. Such an etch-hole protective coating can also be provided on the top or bottom of micro-device 20 (as shown in FIG. 25B) to protect micro-device 20 from the sacrificial portion 14 etchant. FIGS. 25A and 25B illustrate micro-device 20 with two etch holes 30 in micro-device 20 and FIG. 25C illustrates micro-device 20 with one etch hole 30 in micro-device 20. Etch-hole protective coating 33 can comprise a variety of materials depending on the specific materials and chemistries of micro-device 20, sacrificial portion 14, source substrate 10, or intermediate substrate 52. In some embodiments, micro-devices 20 can comprise a same material as sacrificial portions 14, for example silicon, and etch-hole protective coating 33 can comprise one or more oxides or nitrides, for example silicon dioxide or silicon nitride, which are especially useful for a TMAH etchant, as an example. In some embodiments, other materials can be disposed over a protective layer on a silicon substrate and the protective layer materials can be etch-hole protective coatings 33. For example, in some embodiments, micro-devices 20 can comprise potassium sodium niobate (KNN) disposed over a silicon substrate and etch-hole protective coating 33 can comprise one or more oxides or nitrides, for example silicon dioxide or silicon nitride, which are especially useful for a TMAH etchant, as an example. In some embodiments using an SOI (semiconductor on insulator) wafer with a buried oxide insulating layer and a non-silicon semiconductor, a layer of amorphous silicon can provide an effective etch-hole protective coating 33 against an etchant such as concentrated hydrofluoric acid. Etch-hole protective coating 33 can be disposed by evaporation or sputtering after etch holes 30 are formed and can have a thickness of a few microns or less than a micron.

Embodiments of the present disclosure encompass a wide variety of etch hole 30 sizes, shapes, and arrangements useful for a corresponding variety of micro-devices 20 and applications. According to some embodiments, a first etch hole 30 extends into micro-device 20 from a first side, a second etch hole 30 extends into micro-device 20 from a second side that is opposite the first side, and a third etch hole 30 extends into micro-device 20 from a third side different from the first side and from the second side. Third etch hole 30 can comprise a first portion that intersects the third side and a second portion that intersects an end of the first portion at a point other than an end of the second portion. In some embodiments, the first portion bisects the second portion. In some embodiments, first etch hole 30 and second etch hole 30 are parallel. In some embodiments, first etch hole 30 and second etch hole 30 are collinear. In some embodiments, the first portion extends into micro-device 20 past first etch hole 30 and second etch hole 30. Such etch hole 30 arrangements can facilitate etching where concave corners 36 are present in micro-device 20.

According to some embodiments, a plurality of etch holes 30 are disposed in a symmetric arrangement, the symmetric arrangement having a multifold symmetry and comprising a unit cell comprising a first portion of a first etch hole 30 extending outward from a center of micro-device 20, a second etch hole 30 that is an interior etch hole 30 and disposed parallel to a side of micro-device 20, and a third etch hole 30 that is an interior etch hole 30 collinear with a center of micro-device 20. Interior etch holes 30 do not contact an edge or side of micro-device 20. In some embodiments, the symmetric arrangement has a two-fold symmetry or a four-fold symmetry (e.g., as shown in FIGS. 19, 20, and 21A-C). In some embodiments, first etch hole 30 has a cross shape. In some embodiments, second etch hole 30 and third etch hole 30 are straight etch holes 30, e.g., rectangular. In some embodiments, third etch hole 30 is collinear with both a center of micro-device 20 and a corner of micro-device 20. Symmetric etch hole 30 arrangements can reduce stress during etching.

According to some embodiments, a first etch hole 30 comprises a first portion and a second portion (e.g., first and second line segments). The first portion and the second portion intersect at respective interior points of micro-device 20 and a center of first etch hole 30 is disposed closer to a center of micro-device 20 than any side of micro-device 20. According to some embodiments, the first portion and the second portion each intersect the center of micro-device 20. According to some embodiments, the first portion and the second portion form a cross. According to some embodiments, the first portion has a length equal to a length of the second portion. According to some embodiments, first etch hole 30 is an only etch hole 30.

According to some embodiments, micro-device system 94 comprises a fractured structure tether 42. According to some embodiments, micro-device 20 has a thickness less than 1 mm (e.g., no greater than 500, 200, 100, 50, 20, 10, 5, 1, or 0.5 microns). According to some embodiments, micro-device 20 has a length or width less than 1 mm (e.g., no greater than 500, 200, 100, 50, 20, or 10 microns).

According to some embodiments of the present disclosure, a micro-device system 94 comprises a micro-device 20 disposed on a target substrate 60 (or intermediate substrate 52), wherein micro-device 20 is non-native to target substrate 60. Micro-device structure 90 can have a thickness no greater than 1 mm (e.g., no greater than 500, 200, 100, 50, 20, or 10 microns). Micro-device structure 90 can have a length or width no greater than 1 mm (e.g., no greater than 500, 200, 100, 50, 20, or 10 microns).

Micro-device 20 can be native to source substrate 10, or non-native to source substrate 10. A micro-device 20 can be any device that has at least one dimension that is in the micron range, for example having a planar extent from 2 microns by 5 microns to 200 microns by 500 microns (e.g., an extent of 2 microns by 5 microns, 20 microns by 50 microns, or 200 microns by 500 microns) and, optionally, a thickness of from 200 nm to 200 microns (e.g., at least or no more than 2 microns, 20 microns, or 200 microns). In some embodiments, micro-device 20 has a dimension as large as, or larger than 5 mm. Micro-device 20 can have any suitable aspect ratio or size in any dimension and any useful shape, for example a rectangular cross section.

In some embodiments of the present disclosure, micro-devices 20 are small integrated circuits, which may be referred to as chiplets, having a thin substrate with at least one of (i) a thickness of only a few microns, for example less than or equal to 25 microns, less than or equal to 15 microns, or less than or equal to 10 microns, (ii) a width of 5-1000 microns (e.g., 5-10 microns, 10-50 microns, 50-100 microns, or 100-1000 microns), and (iii) a length of 5-1000 microns (e.g., 5-10 microns, 10-50 microns, 50-100 microns, or 100-1000 microns). Such chiplets can be made in a native source semiconductor wafer (e.g., a silicon wafer) having a process side and a back side used to handle and transport the wafer using lithographic processes. Micro-devices 20 can be formed using lithographic processes in an active layer on or in the process side of source substrate 10. Methods of forming such structures are described, for example, in U.S. Pat. No. 8,889,485. According to some embodiments of the present disclosure, source substrates 10 can be provided with micro-devices 20, sacrificial layer 12 (a release layer), sacrificial portions 14, and tethers 40 already formed, or they can be constructed as part of a process in accordance with certain embodiments of the present disclosure.

In certain embodiments, micro-devices 20 can be constructed using foundry fabrication processes used in the art. Layers of materials can be used, including materials such as metals, oxides, nitrides and other materials used in the integrated-circuit art. Micro-devices 20 can have different sizes, for example, less than 1000 square microns or less than 10,000 square microns, less than 100,000 square microns, or less than 1 square mm, or larger. Micro-devices 20 can have, for example, at least one of a length, a width, and a thickness of no more than 500 microns (e.g., no more than 250 microns, no more than 100 microns, no more than 50 microns, no more than 25 microns, or no more than 10 microns). Micro-devices 20 can have variable aspect ratios, for example at least 1:1, at least 2:1, at least 5:1, or at least 10:1. Micro-devices 20 can be rectangular or can have other shapes.

Tethers 40 can comprise any suitable tether material and can incorporate one or more layers, for example one or more layers similar to or the same as those layer(s) of micro-device 20, for example comprising electrode material, dielectric(s), or encapsulation layer(s), including resins, silicon oxides, silicon nitrides, or semiconductors. Tethers 40 can be constructed be depositing (e.g., by evaporation or sputtering) material such as oxide, nitride, metal, polymer, or semiconductor material, and patterning the material, for example using photolithographic methods and materials, such as pattern-wise exposed and etched photoresist.

Source substrate 10 can be any useful substrate with a surface suitable for forming or having patterned sacrificial layers 12, sacrificial portions 14, anchor portions 16, and forming or disposing micro-devices 20. Source substrate 10 can comprise glass, ceramic, polymer, metal, quartz, or semiconductors, for example as found in the integrated circuit or display industries. Sacrificial portion 14 can be a designated portion of sacrificial layer 12, for example an anisotropically etchable portion, for example designated by virtue of etchant applied to source substrate 10 is exposed to it relative to other portions of source substrate 10, or a differentially etchable material from sacrificial layer 12, for example a buried oxide or nitride layer, such as silicon dioxide. A surface of source substrate 10 surface can be substantially planar and suitable for photolithographic processing, for example as found in the integrated circuit or MEMs art. Source substrate 10 can be chosen, for example, based on desirable growth characteristics (e.g., lattice constant, crystal structure, or crystallographic orientation) for growing one or more materials thereon. In some embodiments of the present disclosure, source substrate 10 is anisotropically etchable. For example, source substrate 10 can be a monocrystalline silicon substrate with a {100} orientation. An anisotropically etchable material etches at different rates in different crystallographic directions, due to reactivities of different crystallographic planes to a given etchant. For example, potassium hydroxide (KOH) displays an etch rate selectivity 400 times higher in silicon [100] crystal directions than in silicon [111] directions. In particular, silicon {100} is a readily available, relatively lower cost monocrystalline silicon material. Moreover, in some embodiments, micro-devices 20 made on or in a silicon {100} crystal structure can have less stress and therefore less device bowing after release.

The present disclosure provides, inter alia, a structure and method for improving the release of a micro-transfer-printable micro-device structure 90 from source substrate 10 (source wafer) by etching, in particular where sacrificial layer 12 in source substrate 10 comprises an anisotropically etchable crystalline semiconductor material such as silicon {100}. Patterned sacrificial layer 12 defines sacrificial portions 14 comprising a sacrificial material laterally spaced apart by anchor portions 16. Anchor portions 16 can be a non-sacrificial portion of sacrificial layer 12, can be disposed over sacrificial layer 12, or both. Anchor portions 16 can comprise a non-sacrificial portion of sacrificial layer 12 and, optionally, material deposited on sacrificial layer 12, for example the same material deposited to form micro-devices 20 in a common step or an encapsulating material in a common deposition step. A micro-device 20 is disposed entirely and completely over each sacrificial portion 14 and is physically connected to anchor portion 16 by tether 40. An encapsulation layer comprising an encapsulation material can encapsulate any one or combination of micro-devices 20, tether 40, and anchor portion 16. In some embodiments, an encapsulation layer forms tether 40 or a portion of tether 40 so that tether 40 comprises the encapsulation layer or the encapsulation material. In some embodiments, the encapsulation layer forms anchor portion 16 or a portion of anchor portion 16.

According to some embodiments of the present disclosure, etch hole 30 is disposed in micro-device 20 and extends through micro-device 20. Etch hole 30 can be a hole, for example a shaped hole. Etch holes 30 can be formed by pattern-wise etching micro-device 20, for example using deposited (e.g., by spin or curtain coating) patterned photoresists such as are found in the integrated circuit arts. Once etch hole 30 is present in micro-device 20, an etchant, for example a liquid etchant, can be disposed over micro-device 20 and tether 40 on a side of over micro-device 20 and tether 40 opposite sacrificial portion 14 and pass through etch hole 30 to contact and etch sacrificial portion 14. Etch hole 30 can have various shapes and is necessarily smaller than micro-device 20. In some embodiments, etch hole 30 has a shape approximately similar or geometrically similar (e.g., having the same relative proportions) as micro-device 20.

In some embodiments, etchants can also be applied to sacrificial portion 14 around a perimeter of micro-devices 20 and tethers 40 to release micro-devices 20 from source substrate 10 (in addition to through etch holes 30). In some embodiments of a micro-transfer printing materials system, anisotropically etchable sacrificial portions 14 take a longer time to etch and release micro-devices 20 than is desired, leading to etching damage to micro-devices 20 and tethers 40 and reducing manufacturing throughput. These issues are addressed, according to embodiments of the present disclosure, by providing etch hole 30 in micro-device 20. Etch hole 30 provides access to etchants and can have convex angles that enable fast and efficient etching beneath micro-device 20 and, optionally tether 40. Sacrificial portion 14 etchants pass through etch hole 30 to attack sacrificial portion 14 beneath micro-device 20 at convex corners, decreasing the time necessary to fully release micro-device 20 and tether 40 from source substrate 10 and prepare micro-device 20 for micro-transfer printing with a stamp.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross section line
B cross section line
D direction/distance
$W_T$ tether width
$W_M$ micro-device width
$W_E$ etch-hole width
$L_M$ micro-device length
10 source substrate/source wafer
11 source substrate surface
12 sacrificial layer
14 sacrificial portion
15 gap/cavity
16 anchor portion/anchor
18 source substrate flat
20 micro-device
22 micro-device edge/edge side
24 top side
26 bottom side
30 etch hole
32 etch-hole edge
33 etch-hole protective coating
34 pinned etch front/pinned etch plane 36 concave corner
37 straight line
38 orthogonal line segment angle
40 tether
42 structure tether
50 dielectric structures
52 intermediate substrate
60 target substrate
70 antenna
72 micro-heater
74 micro-fluidic structure/nano-fluidic structure
76 power device
78 channel
90 micro-device structure
92 micro-device structure
94 micro-device structure/micro-device system
95 intermediate structure
100 provide source substrate step
110 provide micro-device step
120 provide etchant step
130 etch source substrate step
140 provide stamp step
150 contact stamp to micro-device step
160 remove stamp and micro-device step
170 provide target substrate step
180 press micro-device to target substrate with stamp step
190 remove stamp step

The invention claimed is:

1. A micro-device structure, comprising:
a micro-device having a top side and a bottom side and comprising one or more etch holes, wherein each of the one or more etch holes is an etch hole that extends entirely through an interior portion of the micro-device substrate from the top side to the bottom side;
one or more anchors; and
wherein any straight line parallel to an edge side of the micro-device drawn from a concave corner on a first edge side of the micro-device to a second edge side of the micro-device opposite the first edge side contacts at least one of the one or more etch holes.

2. The micro-device structure of claim 1, wherein the concave corner is defined by the micro-device.

3. The micro-device structure of claim 1, comprising one or more tethers extending from the micro-device, wherein the concave corner is defined by the micro-device and/or the one or more tethers.

4. A micro-device structure, comprising:
a micro-device having a top side and a bottom side and comprising two or more concave corners and one or more etch holes, wherein each of the one or more etch holes is an etch hole that extends entirely through an interior portion of the micro-device substrate from the top side to the bottom side;
one or more anchors; and
one or more tethers physically connecting the micro-device to the one or more anchors,
wherein any orthogonal line segment angle drawn from a first concave corner defined by the micro-device and/or the one or more tethers and disposed on a first edge side of the micro-device to a second concave corner defined by the micro-device and/or the one or more tethers and disposed on a second edge side of the micro-device adjacent to the first edge side contacts at least one of the one or more etch holes.

5. A micro-device having a top side and a bottom side and comprising one or more etch holes,
wherein each of the one or more etch holes is an etch hole that extends entirely through an interior portion of the micro-device substrate from the top side to the bottom side,
wherein the one or more etch holes comprise a first etch hole extending into the micro-device from a first edge side, a second etch hole extending into the micro-device from a second edge side that is opposite the first edge side, and a third etch hole extending into the micro-device from a third edge side different from the first edge side and from the second edge side, wherein the third etch hole comprises a first portion that intersects the third edge side and a second portion that intersects an end of the first portion at a point other than an end of the second portion.

6. The micro-device of claim 5, wherein the first portion bisects the second portion.

7. The micro-device of claim 5, wherein the first etch hole and the second etch hole are parallel.

8. The micro-device of claim 5, wherein the first etch hole and the second etch hole are collinear.

9. The micro-device of claim 5, wherein the first portion extends into the micro-device past the first etch hole and the second etch hole.

10. A micro-device having a top side and a bottom side and comprising one or more etch holes,
wherein each of the one or more etch holes is an etch hole that extends entirely through an interior portion of the micro-device substrate from the top side to the bottom side, and
wherein the one or more etch holes comprise a plurality of etch holes disposed in a symmetric arrangement, the symmetric arrangement having a multifold symmetry and comprising a unit cell comprising a first portion of a first etch hole extending outward from a center of the micro-device, a second etch hole that is an interior etch hole and disposed parallel to an edge side of the micro-device, and a third etch hole that is an interior etch hole and that is co-linear with a center of the micro-device.

11. The micro-device of claim 10, wherein the symmetric arrangement has a two-fold symmetry or a four-fold symmetry.

12. The micro-device of claim 10, wherein the first etch hole has a cross shape.

13. The micro-device of claim 10, wherein the second etch hole and the third etch hole are straight etch holes.

14. The micro-device of claim 10, wherein the third etch hole is collinear with both the center of the micro-device and a corner of the micro-device.

15. A micro-device having a top side and a bottom side and comprising one or more etch holes,
wherein each of the one or more etch holes is an etch hole that extends entirely through an interior portion of the micro-device substrate from the top side to the bottom side, and
wherein the one or more etch holes comprise a first etch hole comprising a first portion and a second portion, wherein the first portion and the second portion intersect at respective interior points and a center of the first etch hole is disposed closer to a center of the micro-device than any edge side of the micro-device.

16. The micro-device of claim 15, wherein the first portion and the second portion each intersect the center of the micro-device.

17. The micro-device of claim 15, wherein the first portion and the second portion form a cross.

18. The micro-device of claim 15, wherein the first portion has a length equal to a length of the second portion.

19. The micro-device of claim 15, wherein the first etch hole is the only etch hole.

* * * * *